(12) United States Patent
Jeong et al.

(10) Patent No.: US 12,289,908 B2
(45) Date of Patent: *Apr. 29, 2025

(54) SEMICONDUCTOR DEVICE HAVING MULTI-BRIDGE CHANNEL FIELD-EFFECT TRANSISTOR INCLUDING SOURCE/DRAIN PATTERN WITH A PLURALITY OF SEMICONDUCTOR PATTERNS

(71) Applicant: SAMSUNG ELECTRONICS CO., LTD., Suwon-si (KR)

(72) Inventors: Seo Jin Jeong, Incheon (KR); Do Hyun Go, Hwaseong-si (KR); Seok Hoon Kim, Suwon-si (KR); Jung Taek Kim, Yongin-si (KR); Pan Kwi Park, Incheon (KR); Moon Seung Yang, Hwaseong-si (KR); Min-Hee Choi, Suwon-si (KR); Ryong Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/661,171

(22) Filed: May 10, 2024

(65) Prior Publication Data

US 2024/0297234 A1 Sep. 5, 2024

Related U.S. Application Data

(63) Continuation of application No. 17/460,446, filed on Aug. 30, 2021, now Pat. No. 12,021,131.

(30) Foreign Application Priority Data

Dec. 16, 2020 (KR) .................. 10-2020-0176460

(51) Int. Cl.
 *H10D 30/67* (2025.01)
 *H10D 62/13* (2025.01)

(52) U.S. Cl.
 CPC ...... *H10D 30/6735* (2025.01); *H10D 30/6757* (2025.01); *H10D 62/151* (2025.01)

(58) Field of Classification Search
 CPC ......... H01L 29/42392; H01L 29/78696; H01L 29/0665; H01L 29/41775; H01L 29/0847;
 (Continued)

(56) References Cited

U.S. PATENT DOCUMENTS 8,017,487 B2 9/2011 Chong et al.
9,793,404 B2 10/2017 Sung et al.
(Continued)

*Primary Examiner* — Changhyun Yi
(74) *Attorney, Agent, or Firm* — Morgan, Lewis & Bockius LLP

(57) ABSTRACT

A semiconductor device includes an active pattern including a lower pattern and a plurality of sheet patterns; a gate structure disposed on the lower pattern and surrounding the plurality of sheet patterns; and a source/drain pattern filling a source/drain recess formed on one side of the gate structure. The source/drain pattern includes a first semiconductor pattern extending along the source/drain recess and contacting the lower pattern, a second and third semiconductor patterns sequentially disposed on the first semiconductor pattern, a lower surface of the third semiconductor pattern is disposed below a lower surface of a lowermost sheet pattern, a side surface of the third semiconductor pattern includes a planar portion, and a thickness of the second semiconductor pattern on the lower surface of the third semiconductor pattern is different from a thickness of the second semiconductor pattern on the planar portion of the side surface of the third semiconductor pattern.

20 Claims, 25 Drawing Sheets

(58) Field of Classification Search
CPC ............ H01L 29/0673; H10D 30/6735; H10D 30/6757; H10D 62/151
See application file for complete search history.

(56) References Cited

U.S. PATENT DOCUMENTS

| | | |
|---|---|---|
| 10,403,550 B2 | 9/2019 | Chiang et al. |
| 10,700,203 B2 | 6/2020 | Kim et al. |
| 12,021,131 B2 * | 6/2024 | Jeong .................... H01L 29/785 |
| 2019/0067490 A1 * | 2/2019 | Yang .................. H01L 29/1033 |
| 2020/0044045 A1 * | 2/2020 | Wang ................ H01L 29/66439 |
| 2020/0168716 A1 | 5/2020 | Peng et al. |
| 2020/0219976 A1 | 7/2020 | Kim et al. |
| 2020/0220018 A1 | 7/2020 | Jang et al. |
| 2020/0227562 A1 | 7/2020 | Yamazaki et al. |
| 2022/0037520 A1 | 2/2022 | More et al. |
| 2022/0190134 A1 | 6/2022 | Jeong et al. |

\* cited by examiner

FIG. 10
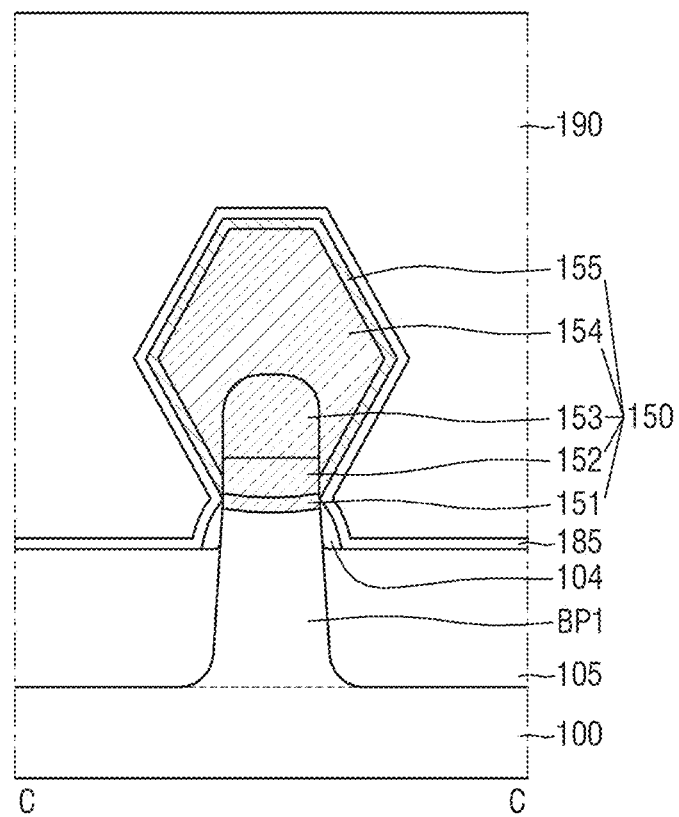
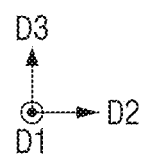

SEMICONDUCTOR DEVICE HAVING MULTI-BRIDGE CHANNEL FIELD-EFFECT TRANSISTOR INCLUDING SOURCE/DRAIN PATTERN WITH A PLURALITY OF SEMICONDUCTOR PATTERNS

CROSS-REFERENCE TO RELATED APPLICATION

This application is a continuation of U.S. application Ser. No. 17/460,446, filed on Aug. 30, 2021, which claims priority under 35 U.S.C. § 119 to Korean Patent Application No. 10-2020-0176460, filed on Dec. 16, 2020, in the Korean Intellectual Property Office, the disclosures of which are incorporated by reference herein in their entirety.

TECHNICAL FIELD

The present disclosure relates to a semiconductor device.

DISCUSSION OF RELATED ART

As one of the scaling techniques for increasing the degree of integration of a semiconductor device, a multi-gate transistor has been proposed in which a multi-channel active pattern (or a silicon body) having a fin or nanowire shape is formed on a substrate and a gate is formed on a surface of the multi-channel active pattern.

The multi-gate transistor utilizes a three-dimensional (3D) channel and thus it is easy to scale. In addition, current control capability may be enhanced, without increasing a gate length of the multi-gate transistor. Further, the short channel effect (SCE), which is a phenomenon in which the electric potential of a channel region is affected by a drain voltage, may be effectively suppressed.

Recently, methods of inducing strain by doping the source and drain with lattice mismatched atoms such as germanium and carbon have been used. Germanium doping of up to 20% in the P-channel metal-oxide-semiconductor field-effect transistor (MOSFET) source and drain may cause uniaxial compressive strain in the channel, thereby increasing hole mobility. To enhance electrical characteristics of a semiconductor device having the multi-gate transistor, it is desirable to apply uniform compressive stress to the multi-channel active pattern.

SUMMARY

Exemplary embodiments of the present disclosure provide a semiconductor device capable of enhancing the performance and reliability of a device.

According to an exemplary embodiment of the present disclosure, a semiconductor device is provided that includes an active pattern including a lower pattern and a plurality of sheet patterns disposed above the lower pattern and spaced apart from the lower pattern; a gate structure disposed on the lower pattern and surrounding the plurality of sheet patterns; and a source/drain pattern filling a source/drain recess and formed on at least one side of the gate structure, in which the source/drain pattern includes a first semiconductor pattern extending along the source/drain recess and contacting the lower pattern, a second semiconductor pattern disposed on the first semiconductor pattern, and a third semiconductor pattern disposed on the second semiconductor pattern, a lower surface of the third semiconductor pattern is disposed below a lower surface of a lowermost sheet pattern of the plurality of sheet patterns, a side surface of the third semiconductor pattern, which is a boundary between the third semiconductor pattern and the second semiconductor pattern, includes a planar portion, and a thickness of the second semiconductor pattern on the lower surface of the third semiconductor pattern is different from a thickness of the second semiconductor pattern on the planar portion of the side surface of the third semiconductor pattern.

According to an exemplary embodiment of the present disclosure, a semiconductor device is provided that includes a substrate; an active pattern extending in a first direction on the substrate; a gate structure disposed on the active pattern and extending in a second direction different from the first direction; and a source/drain pattern filling a source/drain recess and formed on at least one side of the gate structure, in which the source/drain pattern includes a first semiconductor pattern extending along the source/drain recess and contacting the active pattern, a second semiconductor pattern disposed on the first semiconductor pattern, a third semiconductor pattern disposed on the second semiconductor pattern, and a fourth semiconductor pattern that is disposed on the third semiconductor pattern and fills the source/drain recess, a side surface of the third semiconductor pattern, which is a boundary between the third semiconductor pattern and the second semiconductor pattern, includes an upper portion and a lower portion, a distance between the lower portion of the side surface of the third semiconductor pattern and the active pattern in the first direction is substantially constant, and a lower surface of the third semiconductor pattern includes a planar portion.

According to an exemplary embodiment of the present disclosure, a semiconductor device is provided that includes an active pattern including a lower pattern and a plurality of sheet patterns disposed above the lower pattern and spaced apart from the lower pattern; a gate structure disposed on the lower pattern and surrounding the plurality of sheet patterns; and a source/drain pattern filling a source/drain recess and formed on at least one side of the gate structure, in which the source/drain pattern includes a first semiconductor pattern extending along the source/drain recess and contacting the lower pattern, a second semiconductor pattern disposed on the first semiconductor pattern and extending along the first semiconductor pattern, a third semiconductor pattern disposed on the second semiconductor pattern and extending along the second semiconductor pattern, and a fourth semiconductor pattern that is disposed on the third semiconductor pattern and fills the source/drain recess, a lower surface of the third semiconductor pattern is disposed below a lower surface of a lowermost sheet pattern of the plurality of sheet patterns, a side surface of the third semiconductor pattern, which is a boundary between the third semiconductor pattern and the second semiconductor pattern, includes a first planar portion, and an upper surface of the fourth semiconductor pattern includes a second planar portion or an upwardly convex portion.

It should be noted that present disclosure is not limited to the above-described exemplary embodiments, and other aspects and features of the present disclosure will be apparent to those skilled in the art from the following drawings, claims, and detailed descriptions.

BRIEF DESCRIPTION OF THE DRAWINGS

The above and other aspects and features of the present disclosure will become more apparent by describing exemplary embodiments thereof in detail with reference to the accompanying drawings, in which:

FIG. 10 is a view for describing a semiconductor device according to an exemplary embodiment of the present disclosure;

Figure 1:
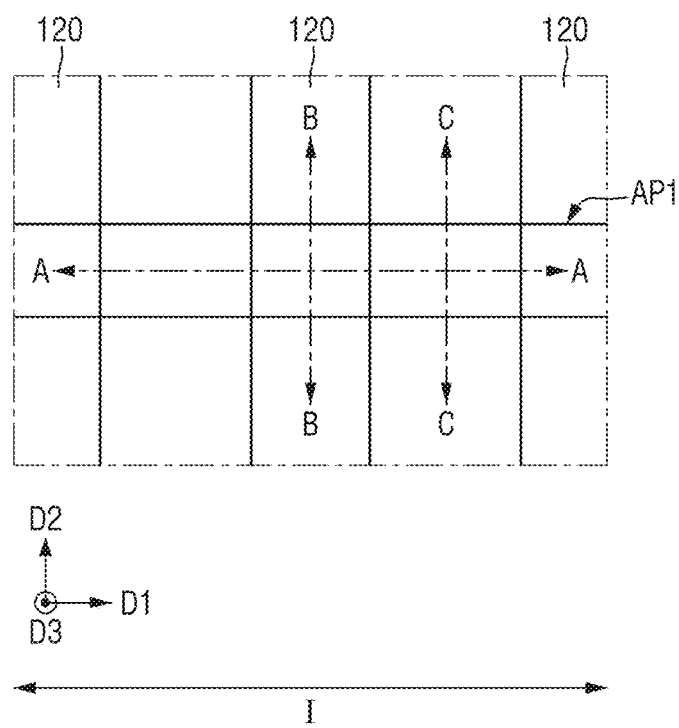
FIG. 1 is an exemplary layout diagram for describing a semiconductor device according to an exemplary embodiment of the present disclosure.

Since the drawings in FIGS. 1-26 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

In the drawings of a semiconductor device according to exemplary embodiments of the present disclosure, as an example, a transistor including nanowires or nano-sheets, a multi-bridge channel field-effect transistor (MBCFET™), and a fin-shaped field-effect transistor (FinFET) including a channel region having a fin-shaped pattern are illustratively shown, but the present disclosure is not limited thereto. For example, the semiconductor device according to an exemplary embodiment of the present disclosure may include a tunneling FET or a three-dimensional (3D) transistor. For example, the three-dimensional (3D) transistor may be a multi-gate transistor uses a three-dimensional (3D) channel such as, for example, a gate-all-around field-effect transistor (GAAFET). For example, the semiconductor device according to an exemplary embodiment of the present disclosure may include a planar transistor. In addition, the present disclosure is applicable to a two-dimensional (2D) material-based FET and a heterostructure thereof. In addition, the semiconductor device according to an exemplary embodiment of the present disclosure may also include a bipolar junction transistor (BJT), a laterally-diffused metal-oxide semiconductor (LDMOS) transistor, or the like.

Figure 2:
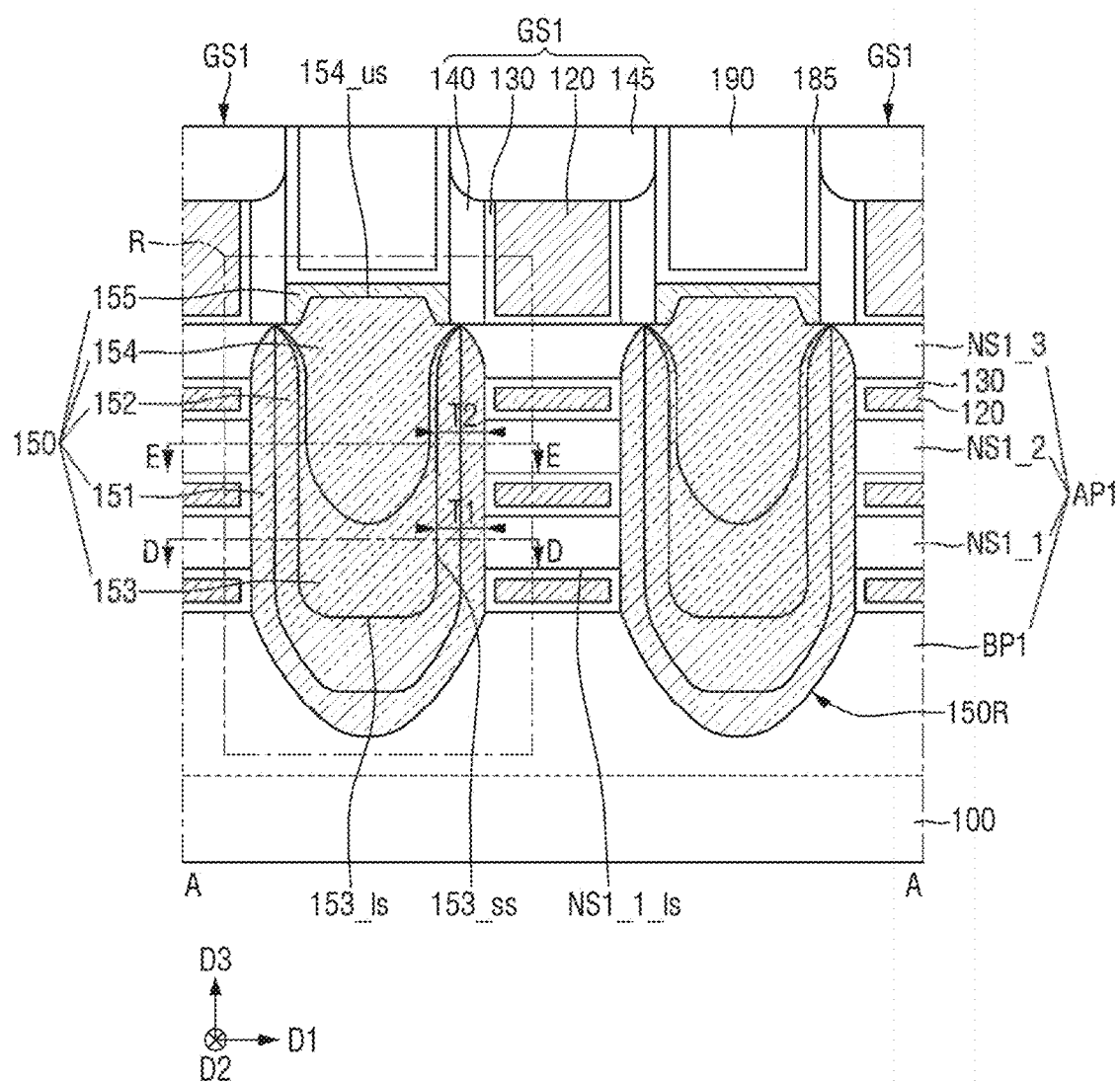
FIG. 2 is a cross-sectional view taken along line A-A of FIG. 1.
Figure 3:
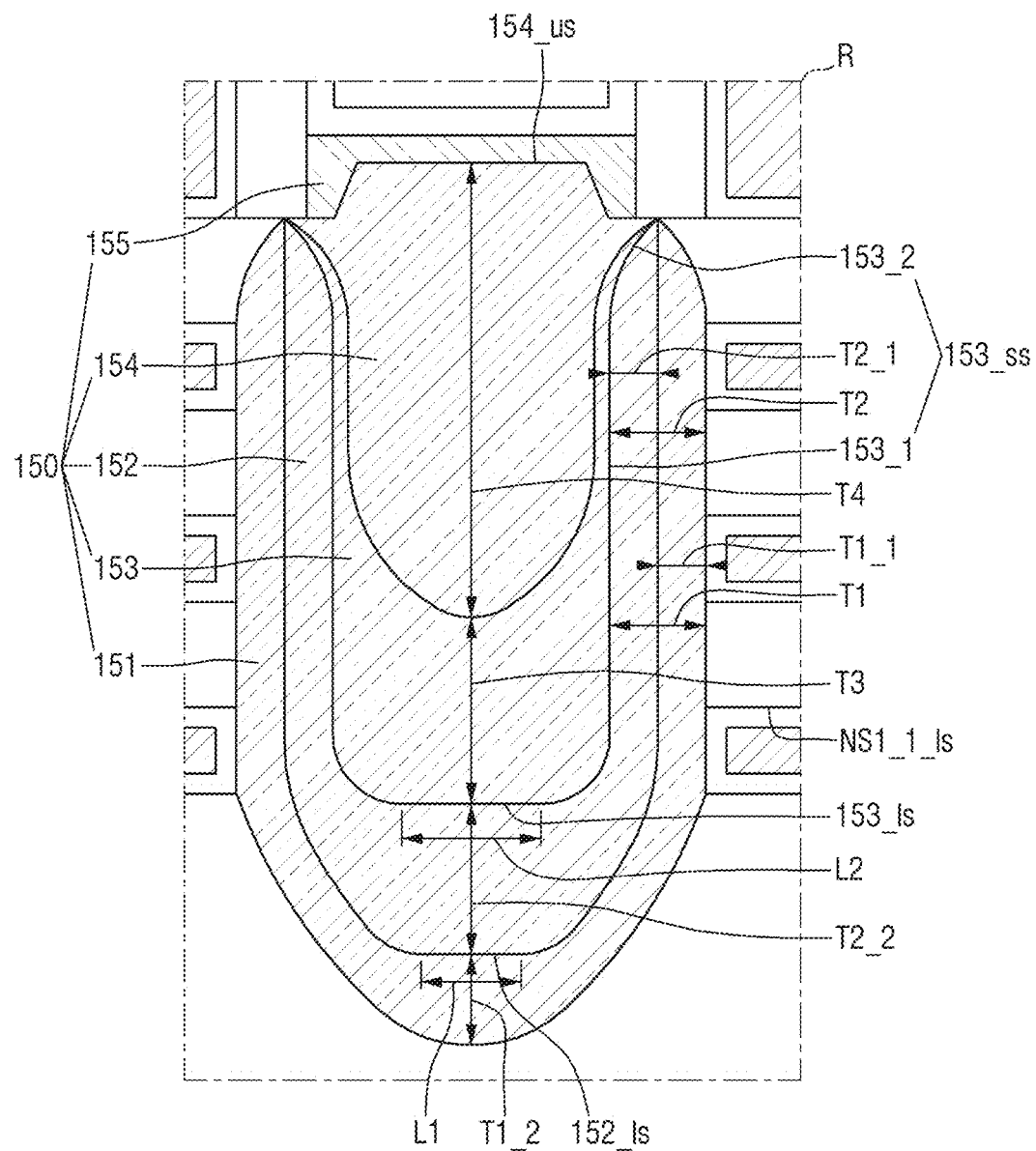
FIG. 3 is an enlarged view of region R of FIG. 2.
Figure 4:
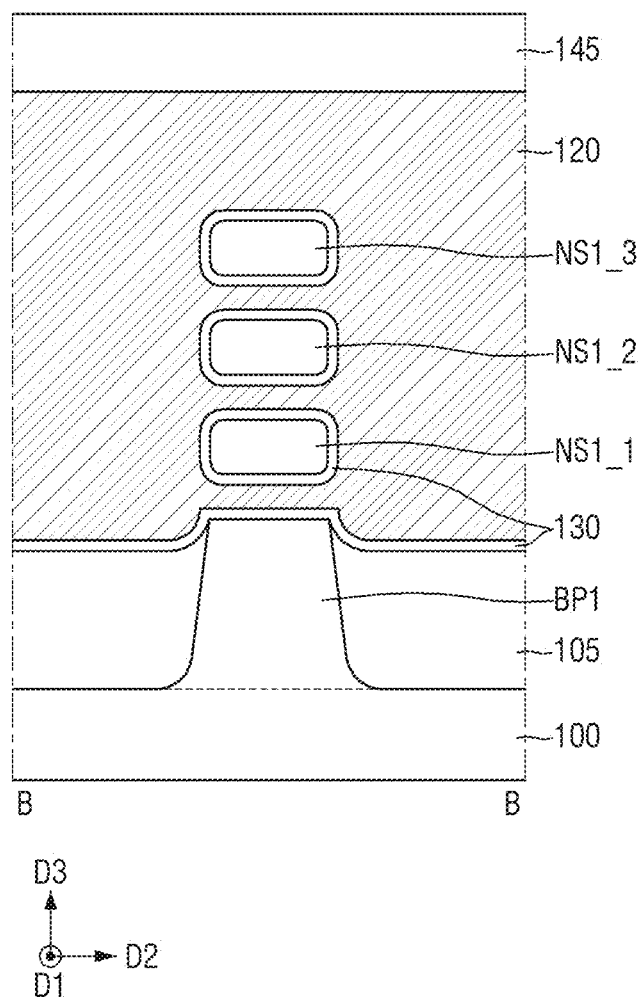
FIG. 4 is a cross-sectional view taken along line B-B of FIG. 1.
Figure 5:
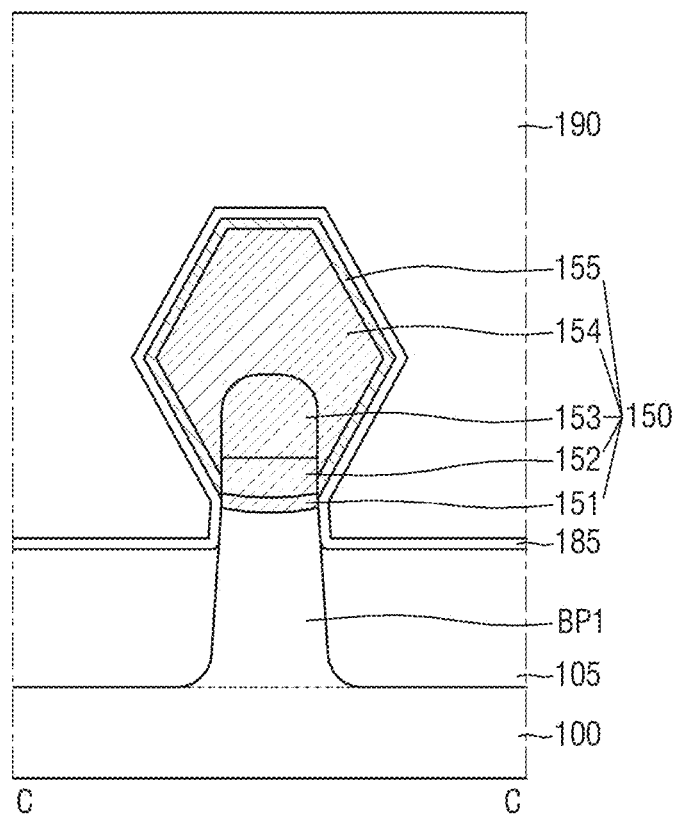
FIG. 5 is a cross-sectional view taken along line C-C of FIG. 1.
Figure 6:
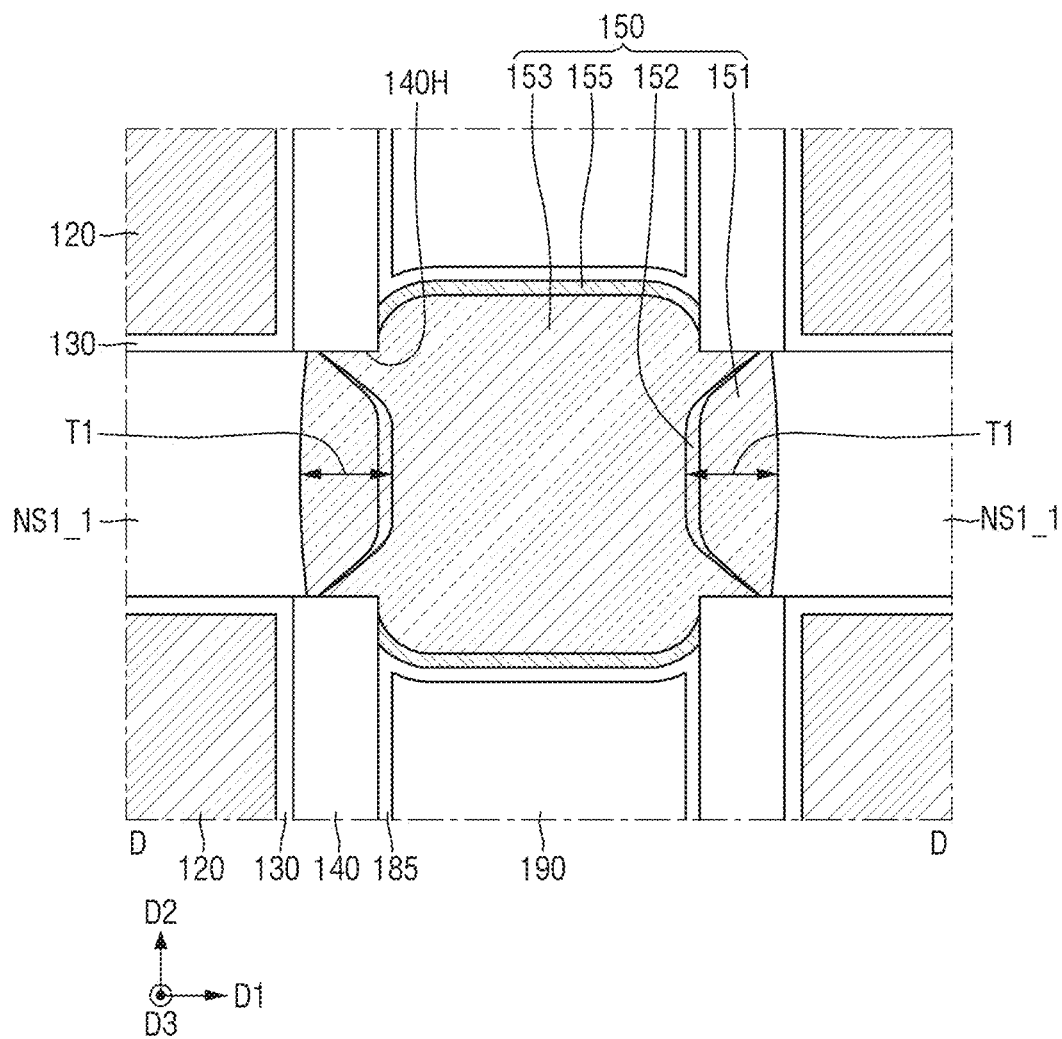
FIG. 6 is a cross-sectional view taken along line D-D of FIG. 2.
Figure 7:
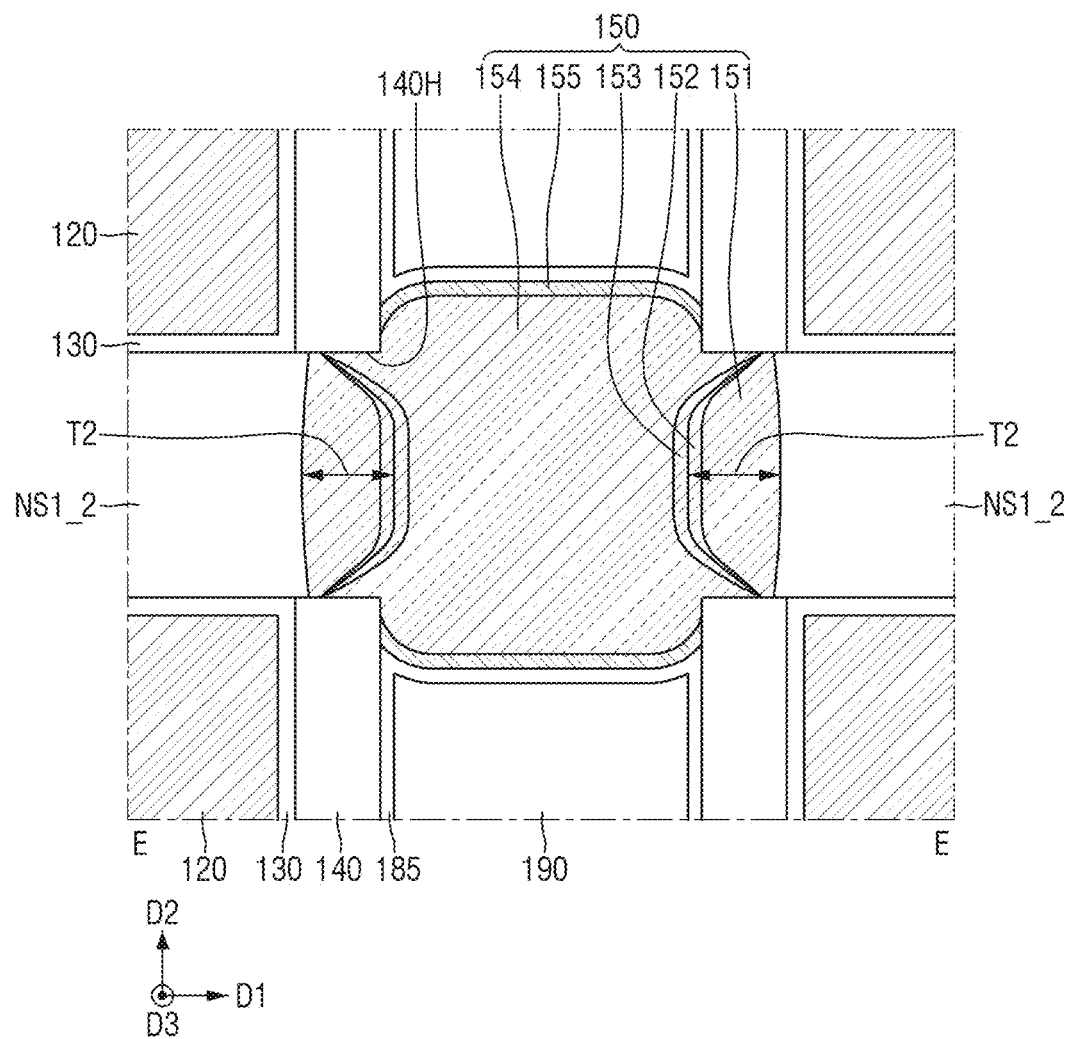
FIG. 7 is a cross-sectional view taken along line E-E of FIG. 2.

FIG. 1 is an exemplary layout diagram for describing a semiconductor device according to an exemplary embodiment of the present disclosure. FIG. 2 is a cross-sectional view taken along line A-A of FIG. 1. FIG. 3 is an enlarged view of region R of FIG. 2. FIG. 4 is a cross-sectional view taken along line B-B of FIG. 1. FIG. 5 is a cross-sectional view taken along line C-C of FIG. 1. FIG. 6 is a cross-sectional view taken along line D-D of FIG. 2. FIG. 7 is a cross-sectional view taken along line E-E of FIG. 2.

For reference, FIGS. 6 and 7 are views shown on a plane of a first direction D1 and a second direction D2. FIG. 6 is a cross-sectional view taken along a first sheet pattern NS1_1. FIG. 7 is a cross-sectional view taken along a second sheet pattern NS1_2.

Referring to FIGS. 1 to 7, a semiconductor device according to an exemplary embodiment of the present disclosure may include a first active pattern AP1, a plurality of first gate structures GS1, and a plurality of first source/drain patterns 150.

A substrate 100 may be a bulk silicon (Si) substrate or a silicon-on-insulator (SOI) substrate. Alternatively, the substrate 100 may be a silicon (Si) substrate or may include another material, for example, germanium (Ge), silicon-germanium (SiGe), silicon-germanium-on-insulator (SGOI), indium antimonide (InSb), a lead tellurium (PbTe) compound, indium arsenide (InAs), indium phosphide (InP), gallium arsenide (GaAs), gallium antimonide (GaSb), aluminum gallium arsenide (AlGaAs), or indium gallium arsenide (InGaAs), but the present disclosure is not limited thereto. For example, the substrate 100 may include one or more semiconductor layers or structures and may include active or operable portions of semiconductor devices.

The first active pattern AP1 may be disposed on the substrate 100, and may be elongated in the first direction D1. For example, the first active pattern AP1 may be disposed in a region in which a p-type metal-oxide-semiconductor (PMOS) is formed. In other words, the first active pattern AP1 may be disposed in a PMOS region.

The first active pattern AP1 may be, for example, a multi-channel active pattern. For example, the first active pattern AP1 may include a first lower pattern BP1 and first to third sheet patterns NS1_1 to NS1_3.

The first lower pattern BP1 may protrude from the substrate 100, and may be elongated in the first direction D1.

The first to third sheet patterns NS1_1 to NS1_3 may be disposed above the first lower pattern BP1, and may be spaced apart from the first lower pattern BP1 in a third direction D3. For example, the second sheet pattern NS1_2 may be spaced apart from the first sheet pattern NS1_1 in the third direction D3 above the first sheet pattern NS1_1, and the third sheet pattern NS1_3 may be spaced apart from the second sheet pattern NS1_2 in the third direction D3 above the second sheet pattern NS1_2. Here, the third direction D3 may be a direction intersecting both the first and second directions D1 and D2. For example, the third direction D3 may be the thickness direction of the substrate 100. That is, the first sheet pattern NS1_1 may be a sheet pattern disposed at the lowermost portion (i.e., a lowermost sheet pattern) of the first to third sheet patterns NS1_1 to NS1_3, and the third sheet pattern NS1_3 may be a sheet pattern disposed at the uppermost portion (i.e., an uppermost sheet pattern) of the first to third sheet patterns NS1_1 to NS1_3. The first active pattern AP1 is illustrated as including three sheet patterns NS1_1, NS1_2, and NS1_3, but this is only for convenience of description, and the present disclosure is not limited thereto. For example, the number of sheet patterns included in the first active pattern AP1 may be two or more than three.

The first lower pattern BP1 may be formed by etching a portion of the substrate 100 and/or may include an epitaxial layer grown from the substrate 100. For example, the first lower patterns BP1 may be formed by partially removing an upper portion of the substrate 100, and thus may be integrally formed with the substrate 100, but the present disclosure is not limited thereto. The first lower pattern BP1 may include silicon (Si) or germanium (Ge), which is an elemental semiconductor material. In addition, the first lower pattern BP1 may include a compound semiconductor, and may include, for example, a group IV-IV compound semiconductor or a group III-V compound semiconductor.

The group IV-IV compound semiconductor may be, for example, a binary compound or a ternary compound including at least two or more of carbon (C), silicon (Si), germanium (Ge), and tin (Sn), or a compound doped with a group IV element in the binary or ternary compound. The group IV-IV compound semiconductor may include, for example, silicon-germanium (SiGe), silicon carbide (SiC), or silicon germanium carbide (SiGeC), but the present disclosure is not limited thereto.

The group III-V compound semiconductor may be, for example, a binary compound, a ternary compound, or a quaternary compound, which is formed by a combination of at least one of aluminum (Al), gallium (Ga), and indium (In) as a group III element, with one of phosphorus (P), arsenic (As), and antimony (Sb) as a group V element. The group III-V compound semiconductor may include, for example, gallium phosphide (GaP), gallium arsenide (GaAs), indium arsenide (InAs), indium phosphide (InP), gallium antimonide (GaSb), indium antimonide (InSb), aluminum gallium arsenide (AlGaAs), indium gallium arsenide (InGaAs), or aluminum indium gallium phosphide (AlInGaP) but the present disclosure is not limited thereto. The first to third sheet patterns NS1_1 to NS1_3 may include silicon (Si) or germanium (Ge), which is an elemental semiconductor material, a group IV-IV compound semiconductor, and/or a group III-V compound semiconductor. The first to third sheet patterns NS1_1 to NS1_3 and the first lower pattern BP1 may include the same material or different materials.

In the semiconductor device according to an exemplary embodiment of the present disclosure, the first lower pattern BP1 may be a silicon lower pattern including silicon (Si), and the first to third sheet patterns NS1_1 to NS1_3 may each be a silicon sheet pattern including silicon (Si).

A field insulating layer 105 may be formed on the substrate 100, and may be disposed on a sidewall of the first lower pattern BP1.

The field insulating layer 105 may entirely cover the sidewall of the first lower pattern BP1. For example, the first lower pattern BP1 may not protrude beyond the top surface of the field insulating layer 105 in the third direction D3. However, the present disclosure is not limited thereto. For example, the field insulating layer 105 may cover a portion of the sidewall of the first lower pattern BP1. In this case, a portion of the first lower pattern BP1 may protrude further than an upper surface of the field insulating layer 105 in the third direction D3.

The first to third sheet patterns NS1_1 to NS1_3 are disposed higher than the upper surface of the field insulating layer 105. The field insulating layer 105 may include, for example, an oxide layer, a nitride layer, an oxynitride layer, or a combination thereof. The field insulating layer 105 is illustrated as being a single layer, but this is only for convenience of description, and the present disclosure is not limited thereto. For example, the field insulating layer 105 may further include a field liner, which may include a nitride, for example, silicon nitride ($Si_3N_4$), or an oxide, for example, tonen silazene (TOSZ), but the present disclosure is not limited thereto.

The plurality of first gate structures GS1 may be disposed on the substrate 100 and on the field insulating layer 105. Each of the first gate structures GS1 may extend in the second direction D2. The adjacent first gate structures GS1 may be spaced apart from each other in the first direction D1.

The first gate structures GS1 may be disposed on the first active pattern AP1, and may intersect the first active pattern AP1. For example, the first gate structures GS1 may extend in the second direction D2 crossing the first active pattern AP1 extending in the first direction D1.

The first gate structures GS1 may intersect the first lower pattern BP1, and may surround the respective first to third sheet patterns NS1_1 to NS1_3.

Each of the first gate structures GS1 may include, for example, a first gate electrode 120, a first gate insulating layer 130, a first gate spacer 140, and a first gate capping pattern 145.

The first gate electrode 120 may be formed on the first lower pattern BP1, and may intersect the first lower pattern BP1. The first gate electrode 120 may surround the first to third sheet patterns NS1_1 to NS1_3.

The first gate electrode 120 may include at least one of, for example, a metal, a metal alloy, a conductive metal nitride, a metal silicide, a doped semiconductor material, a conductive metal oxide, or a conductive metal oxynitride. The first gate electrode 120 may include at least one of, for example, titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminide (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), hafnium (Hf), nickel (Ni), platinum (Pt), ytterbium (Yb), terbium (Tb), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), dysprosium (Dy), erbium (Er), palladium (Pd), iridium (Ir), osmium (Os), silver (Ag), gold (Au), zinc (Zn), vanadium (V), or a combination thereof, but the present disclosure is not limited thereto. The conductive metal oxide and the conductive metal oxynitride may be included in an oxidized form of the above-described materials, but the present disclosure is not limited thereto.

The first gate electrodes 120 may be disposed on both sides of the first source/drain pattern 150 to be described below. For example, the first gate electrodes 120 disposed on both sides of the first source/drain pattern 150 may be normal gate electrodes used as a gate of the transistor. For example, the first gate electrode 120 disposed on one side of the first source/drain pattern 150 may be a normal gate electrode, and the first gate electrode 120 disposed on the other side of the first source/drain pattern 150 may be a dummy gate electrode.

The first gate insulating layer 130 may extend along the upper surface of the field insulating layer 105 and an upper surface of the first lower pattern BP1, and may surround the first sheet pattern NS1_1. The first gate insulating layer 130 may be disposed along the circumference of each of the first to third sheet patterns NS1_1 to NS1_3. The first gate electrode 120 is disposed on the first gate insulating layer 130. The first gate insulating layer 130 is disposed between the first gate electrode 120 and the first to third sheet patterns NS1_1 to NS1_3.

The first gate insulating layer 130 may include, for example, silicon oxide ($SiO_2$), silicon oxynitride (SiON), silicon nitride ($Si_3N_4$), or a high dielectric constant (high-k) material having a dielectric constant higher than that of silicon oxide ($SiO_2$). For example, the high-k material may have a dielectric constant of about 10 to about 25. The high-k material may include, for example, one or more of boron nitride (BN), hafnium oxide ($HfO_2$), hafnium silicon oxide ($HfSiO_4$), hafnium aluminum oxide ($HfAlO_3$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), barium strontium titanium oxide ($BaSrTi_2O_6$), barium titanium oxide ($BaTiO_3$), strontium titanium oxide ($SrTiO_3$), yttrium oxide ($Y_2O_3$), aluminum oxide ($Al_2O_3$), lead scandium tantalum oxide ($Pb(Sc,Ta)O_3$), and lead zinc niobate [$Pb(Zn_{1/3}Nb_{2/3})O_3$].

The first gate insulating layer 130 is illustrated as being a single layer, but this is only for convenience of description, and the present disclosure is not limited thereto. The first gate insulating layer 130 may include a plurality of layers. For example, the first gate insulating layer 130 may also include an interfacial layer disposed between the first sheet pattern NS1_1 and the first gate electrode 120, and a high dielectric constant insulating layer as described above. The interfacial layer may include a low dielectric material layer having a dielectric constant of about 9 or less, for example, a silicon oxide ($SiO_2$) layer, a silicon oxynitride (SiON) layer, or a combination thereof.

The semiconductor device according to an exemplary embodiment of the present disclosure may include a negative capacitance (NC) FET using a negative capacitor. For example, the first gate insulating layer 130 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the sum of the capacitances of the two or more capacitors is less than the capacitance of each individual capacitor. On the other hand, when at least one of the capacitances of two or more capacitors connected in series has a negative value, the sum of the capacitances of the two or more capacitors may have a positive value and may be greater than the absolute value of each individual capacitance.

When a ferroelectric material layer having a negative capacitance and a paraelectric material layer having a positive capacitance are connected in series, the total capacitance value of the ferroelectric material layer and the paraelectric material layer connected in series may increase. Using the fact that the total capacitance value increases, a transistor including the ferroelectric material layer may have a sub-threshold swing (SS) of less than 60 mV/decade at room temperature. For example, in the negative capacitance field-effect transistor (NC-FET), the insulating ferroelectric material layer served as a negative capacitor so that channel surface potential can be amplified more than the gate voltage, and hence the device can operate with SS less than 60 mV/decade at room temperature.

The ferroelectric material layer may have ferroelectric properties. The ferroelectric material layer may include, for example, at least one of hafnium oxide ($HfO_2$), hafnium zirconium oxide ($HfZrO_4$), barium strontium titanium oxide ($BaSrTi_2O_6$), barium titanium oxide ($BaTiO_3$), or lead zirconium titanium oxide ($Pb(Zr,Ti)O_3$). Each of the ferroelectric materials described above, the ratio between metals may vary and the composition may be nonstoichiometric. For example, the hafnium zirconium oxide may be a material obtained by doping hafnium oxide ($HfO_2$) with zirconium (Zr). For example, the hafnium zirconium oxide may be a compound of hafnium (Hf), zirconium (Zr), and oxygen (O). In other words, hafnium zirconium oxide may be represented by $Hf_xZr_yO_z$ with various combinations of numerical values of x, y and z instead of being represented by $HfZrO_4$.

The ferroelectric material layer may further include a doped dopant. For example, the dopant may include at least one of, for example, aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on the type of ferroelectric material included in the ferroelectric material layer.

When the ferroelectric material layer includes hafnium oxide ($HfO_2$), the dopant included in the ferroelectric material layer may include, for example, at least one of gadolinium (Gd), silicon (Si), zirconium (Zr), aluminum (Al), or yttrium (Y). However, the present disclosure is not limited thereto. For example, other dopants such as, for example, strontium (Sr), lanthanum (La), titanium (Ti) and tantalum (Ta) may also be used to dope the ferroelectric material layer including hafnium oxide ($HfO_2$).

When the dopant is aluminum (Al), the ferroelectric material layer may include 3 to 8 at % (atomic %) of aluminum (Al). Here, the ratio of the dopant may be a ratio of aluminum to the sum of hafnium (Hf) and aluminum (Al).

When the dopant is silicon (Si), the ferroelectric material layer may include 2 to 10 at % of silicon. When the dopant is yttrium (Y), the ferroelectric material layer may include 2 to 10 at % of yttrium (Y). When the dopant is gadolinium (Gd), the ferroelectric material layer may include 1 to 7 at % of gadolinium (Gd). When the dopant is zirconium (Zr), the ferroelectric material layer may include 50 to 80 at % of zirconium (Zr).

The paraelectric material layer may have paraelectric properties. The paraelectric material layer may include, for example, silicon oxide ($SiO_2$) and/or a metal oxide having a high dielectric constant. The metal oxide included in the paraelectric material layer may include, for example, at least one of hafnium oxide ($HfO_2$), barium strontium titanium oxide ($BaSrTi_2O_6$), zirconium oxide ($ZrO_2$), or aluminum oxide ($Al_2O_3$), but the present disclosure is not limited thereto.

The ferroelectric material layer and the paraelectric material layer may include the same material. The ferroelectric material layer has ferroelectric properties, but the paraelectric material layer may not have ferroelectric properties. For example, when the ferroelectric material layer and the paraelectric material layer include hafnium oxide ($HfO_2$), the crystal structure of the hafnium oxide ($HfO_2$) included in the ferroelectric material layer is different from that of the hafnium oxide ($HfO_2$) included in the paraelectric material layer.

The ferroelectric material layer may have a thickness thick enough to have ferroelectric properties. The thickness of the ferroelectric material layer may be, for example, in a range from about 0.5 nm to about 10 nm, but the present disclosure is not limited thereto. The thickness of the ferroelectric material layer may vary depending on the type of ferroelectric material because the critical thickness representing the ferroelectric properties may vary for each ferroelectric material.

The first gate insulating layer 130 may include one ferroelectric material layer, but the present disclosure is not limited thereto. For example, the first gate insulating layer 130 may include a plurality of ferroelectric material layers spaced apart from each other. The first gate insulating layer 130 may have a stacked structure in which a plurality of ferroelectric material layers and a plurality of paraelectric material layers are alternately stacked.

The first gate spacer 140 may be disposed on a sidewall of the first gate electrode 120. The first gate spacer 140 may not be disposed between the first lower pattern BP1 and the first sheet pattern NS1_1 and between the first to third sheet patterns NS1_1 to NS1_3 adjacent to each other in the third direction D3. However, the present disclosure is not limited thereto. For example, the first gate spacer 140 may be formed to have a structure similar to a third gate spacer 340 which is to be described with reference to FIG. 20, and in FIG. 20, the third gate spacer 340 may include an outer spacer 341 and an inner spacer 342 to be described, unlike the first gate spacer 140. The inner spacer 342 may be disposed between the third region sheet patterns NS3 adjacent to each other in the third direction D3.

The first gate spacer 140 may include, at least one of, for example, silicon nitride ($Si_3N_4$), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), or a combination thereof.

The first gate capping pattern 145 may be disposed on the first gate electrode 120 and the first gate spacer 140. An upper surface of the first gate capping pattern 145 may be coplanar with an upper surface of an interlayer insulating layer 190. However, the present disclosure is not limited thereto. For example, unlike that illustrated in the drawings, the first gate capping pattern 145 may be disposed on the first gate electrode 120 and the first gate insulating layer 130, and disposed between the first gate spacers 140.

The first gate capping pattern 145 may include, at least one of, for example, silicon nitride ($Si_3N_4$), silicon oxynitride (SiON), silicon carbonitride (SiCN), silicon oxycarbonitride (SiOCN), or a combination thereof. The first gate capping pattern 145 may include a material having an etch selectivity with respect to the interlayer insulating layer 190.

A first source/drain recess 150R may be formed on at least one side of the first gate structure GS1, and may extend in the third direction D3. A bottom surface of the first source/drain recess 150R may be disposed below an upper surface of the first sheet pattern NS1_1. At least a portion of the bottom surface of the first source/drain recess 150R may be defined by the first lower pattern BP1.

A width of the first source/drain recess 150R, which is defined by the first lower pattern BP1, in the first direction D1 may increase as it moves away from the first lower pattern BP1. For example, the width of the first source/drain recess 150R in the first direction D1 may increase as it moves away from the substrate 100 in the third direction D3. Alternatively, the width of the first source/drain recess 150R, which is defined by the first lower pattern BP1, in the first direction D1 may increase and then become constant as it moves away from the first lower pattern BP1. For example, the width of the first source/drain recess 150R in the first direction D1 may increase and then become constant as it moves away from the substrate 100 in the third direction D3. For example, the width of the first source/drain recess 150R in the first direction D1 may increase until the first source/drain recess 150R reaches an uppermost surface of the first lower pattern BP1 and then may become constant as it moves above the uppermost surface of the first lower pattern BP1.

The width of the first source/drain recess 150R, which is defined by the first gate structure GS1 disposed between the first lower pattern BP1 and the first sheet pattern NS1_1, in the first direction D1 may be constant. Alternatively, for example, the width of the first source/drain recess 150R, which is defined by the first gate structure GS1 disposed between the first lower pattern BP1 and the first sheet pattern NS1_1, in the first direction D1 may increase and then become constant as it moves away from the upper surface of the first lower pattern BP1. Alternatively, for example, the width of the first source/drain recess 150R, which is defined by the first gate structure GS1 disposed between the first lower pattern BP1 and the first sheet pattern NS1_1, in the first direction D1 may increase as it moves away from the upper surface of the first lower pattern BP1.

A sidewall of the first source/drain recess 150R may be defined by the first to third sheet patterns NS1_1 to NS1_3 and the first gate structure GS1. In the first gate structure GS1, the first gate insulating layer 130 and the first gate spacer 140 may define a portion of the first source/drain recess 150R. In FIGS. 6 and 7, the first source/drain recess 150R may include a sidewall of a spacer hole 140H.

A width of the sidewall of the first source/drain recess 150R, which is defined by the first and second sheet patterns NS1_1 and NS1_2 and the first gate insulating layer 130 disposed between the first to third sheet patterns NS1_1 to NS1_3 adjacent to each other, in the first direction D1 may be constant as it moves away from the first lower pattern BP1. A width of the first source/drain recess 150R here means the width of the first source/drain recess 150R measured from one sidewall to the opposite sidewall in the first direction D1. A width of an upper portion of the sidewall of the first source/drain recess 150R in the first direction D1 may decrease as it moves away from the first lower pattern BP1. For example, the width of the sidewall of the first source/drain recess 150R, which is defined by the third sheet pattern NS1_3, in the first direction D1 may decrease as it moves away from the first lower pattern BP1, but the present disclosure is not limited thereto. For example, the width of the sidewall of the first source/drain recess 150R in the first direction D1 in a region defined by the first and second sheet patterns NS1_1 and NS1_2 may be constant, and in a region defined by the third sheet pattern NS1_3 may decrease as it moves away from the first lower pattern BP1.

The first source/drain pattern 150 may be disposed in the first source/drain recess 150R. The first source/drain pattern 150 may be formed on at least one side of the first gate structure GS1.

The first source/drain pattern 150 may be formed on the first active pattern AP1, and may be disposed on the first lower pattern BP1. The first source/drain pattern 150 may be connected to the first to third sheet patterns NS1_1 to NS1_3, and may be in contact with the first to third sheet patterns NS1_1 to NS1_3. For example, the first source/drain pattern 150 may be electrically connected to the first to third sheet patterns NS1_1 to NS1_3 and the first lower pattern BP1, and may be electrically insulated from the first gate structure GS1 by the first gate insulating layer 130 and the first gate spacer 140.

The first source/drain pattern 150 may be disposed on a side surface of the first gate structure GS1, and may be disposed between the first gate structures GS1 adjacent to each other in the first direction D1. For example, the first source/drain patterns 150 may be disposed on both sides of the first gate structure GS1. Unlike that illustrated in the drawings, the first source/drain pattern 150 may be disposed on one side of the first gate structure GS1 and may not be disposed on the other side of the first gate structure GS1.

The first source/drain pattern 150 may be included in a source/drain of a transistor that uses the first to third sheet patterns NS1_1 to NS1_3 as a channel region.

A portion of the first source/drain pattern 150 may pass through the spacer hole 140H. The first source/drain pattern 150 may fill at least a portion of the spacer hole 140H. The first source/drain pattern 150 may be in contact with the first to third sheet patterns NS1_1 to NS1_3 through the spacer hole 140H.

The first gate spacer 140 may not be disposed between the first gate electrode 120 located between the first to third sheet patterns NS1_1 to NS1_3 adjacent to each other, and the first source/drain pattern 150. Thus, the first source/drain pattern 150 may be in contact with the first gate insulating layer 130.

The first source/drain pattern 150 may include first to fourth semiconductor patterns 151 to 154 and a capping semiconductor pattern 155.

The first semiconductor pattern 151 may extend along a profile of the first source/drain recess 150R. The first semiconductor pattern 151 may be in contact with the first lower pattern BP1, the first to third sheet patterns NS1_1 to NS1_3, and the first gate insulating layer 130. The second semiconductor pattern 152 may be disposed on the first semiconductor pattern 151, and may extend along the first semiconductor pattern 151. The second semiconductor pattern 152 may be in contact with the first semiconductor pattern 151. The third semiconductor pattern 153 may be disposed on the second semiconductor pattern 152, and may extend along the second semiconductor pattern 152. The third semiconductor pattern 153 may be in contact with the second semiconductor pattern 152. The fourth semiconductor pattern 154 may be disposed on and in contact with the third semiconductor pattern 153. The fourth semiconductor pattern 154 may fill the first source/drain recess 150R. For example, the fourth semiconductor pattern 154 may fill the area of the first source/drain recess 150R that remains after the formation of the first to third semiconductor patterns 151 to 153.

A lower surface 153_1s of the third semiconductor pattern 153 may be disposed below a lower surface NS1_1_1s of the first sheet pattern NS1_1. The lower surface 153_1s of the third semiconductor pattern 153 may include a planar portion. At least a portion of the lower surface 153_1s of the third semiconductor pattern 153 may be flat.

A side surface 153_ss of the third semiconductor pattern 153, which is a boundary between the third semiconductor pattern 153 and the second semiconductor pattern 152, may include a lower portion 153_1 and an upper portion 153_2.

The lower portion 153_1 of the side surface 153_ss of the third semiconductor pattern 153 may include a planar portion. At least a portion of the lower portion 153_1 of the side surface 153_ss of the third semiconductor pattern 153 may be flat. In other words, a width of the third semiconductor pattern 153, which is defined by the lower portion 153_1 of the side surface 153_ss of the third semiconductor pattern 153, in the first direction D1 may be constant. A width of the third semiconductor pattern 153, which is defined by the upper portion 153_2 of the side surface 153_ss of the third semiconductor pattern 153, in the first direction D1 may increase as it moves away from the first lower pattern BP1.

The planar portion of the lower portion 153_1 of the side surface 153_ss of the third semiconductor pattern 153 may overlap the first sheet pattern NS1_1 and the second sheet pattern NS1_2 in the first direction D1. The planar portion of the lower portion 153_1 of the side surface 153_ss of the third semiconductor pattern 153 may overlap at least a portion of a third sheet pattern NS1_3 in the first direction D1. For example, the planar portion of the lower portion 153_1 of the side surface 153_ss of the third semiconductor pattern 153 may overlap all or a part of each of the first to third sheet patterns NS1_1 to NS1_3 in the first direction D1, and the upper portion 153_2 of the side surface 153_ss of the third semiconductor pattern 153 may overlap a portion of the third sheet pattern NS1_3 in the first direction D1.

A distance T1 between the planar portion of the lower portion 153_1 of the side surface 153_ss of the third semiconductor pattern 153 and the first sheet pattern NS1_1 may be substantially equal to a distance T2 between the planar portion of the lower portion 153_1 of the side surface 153_ss of the third semiconductor pattern 153 and the second sheet pattern NS1_2. The distance T1 between the planar portion of the lower portion 153_1 of the side surface 153_ss of the third semiconductor pattern 153 and the first sheet pattern NS1_1 may be substantially equal to a distance between the planar portion of the lower portion 153_1 of the side surface 153_ss of the third semiconductor pattern 153 and the first gate insulating layer 130 disposed between the first to third sheet patterns NS1_1 to NS1_3. For example, the distance between the lower portion 153_1 of the side surface 153_ss of the third semiconductor pattern 153 and the first active pattern AP1 (e.g., first to third sheet patterns NS1_1 to NS1_3) in the first direction D1 may be substantially constant. Here, "substantially constant" means constant, except minor deviation may occur due to manufacturing process.

The distance T1 between the planar portion of the lower portion 153_1 of the side surface 153_ss of the third semiconductor pattern 153 and the first sheet pattern NS1_1 may be, for example, substantially equal to a distance between the planar portion of the lower portion 153_1 of the side surface 153_ss of the third semiconductor pattern 153 and the first gate insulating layer 130 disposed between the first lower pattern BP1 and the first sheet pattern NS1_1. Alternatively, for example, the distance T1 from the planar portion of the lower portion 153_1 of the side surface 153_ss of the third semiconductor pattern 153 to the first sheet pattern NS1_1 may be greater than the distance to the first gate insulating layer 130 disposed between the first lower pattern BP1 and the first sheet pattern NS1_1. Alternatively, for example, the distance T1 from the planar portion of the lower portion 153_1 of the side surface 153_ss of the third semiconductor pattern 153 to the first sheet pattern NS1_1 may be smaller than the distance to the first gate insulating layer 130 disposed between the first lower pattern BP1 and the first sheet pattern NS1_1.

Due to the planar portion of the lower portion 153_1 of the side surface 153_ss of the third semiconductor pattern 153, which may be a main layer of the first source/drain pattern 150, overlaps with and has substantially equal distance to each of the first to third sheet patterns NS1_1 to NS1_3, a flat junction profile is applied equally to the first to third sheet patterns NS1_1 to NS1_3, which are used as a channel region. Accordingly, in the semiconductor device according to an exemplary embodiment of the present disclosure, a boundary surface between the first source/drain pattern 150 and the first to third sheet patterns NS1_1 to NS1_3 may realize a substantially uniform junction profile. That is, the first source/drain pattern 150 may realize a uniform junction profile with the first sheet pattern NS1_1 disposed at the lowermost portion of the first active pattern AP1 as well as the second and third sheet patterns NS1_2 and NS1_3. Thus, compressive stress may be applied to the first sheet pattern NS1_1 as well as the second and third sheet patterns NS1_2 and NS1_3 from the first source/drain pattern 150, thereby enhancing the mobility of electric charges. Accordingly, the electrical characteristics of the semiconductor device may be enhanced.

A thickness of the first semiconductor pattern 151 may not be constant. A thickness T1_1 of the first semiconductor pattern 151 on the planar portion of the lower portion 153_1 of the side surface 153_ss of the third semiconductor pattern 153 may be different from a thickness T1_2 of the first semiconductor pattern 151 on the lower surface 153_1s of the third semiconductor pattern 153. The thickness T1_1 of the first semiconductor pattern 151 on the planar portion of the lower portion 153_1 of the side surface 153_ss of the third semiconductor pattern 153 may be smaller than the thickness T1_2 of the first semiconductor pattern 151 on the lower surface 153_1s of the third semiconductor pattern 153.

A lower surface 152_1s of the second semiconductor pattern 152 may include a planar portion. The planar portion of the lower surface 152_1s of the second semiconductor pattern 152 may overlap the planar portion of the lower surface 153_1s of the third semiconductor pattern 153 in the third direction D3. The second semiconductor pattern 152 may be formed through a bottom up growth process, and thus, the planar portion of the lower surface 153_1s of the third semiconductor pattern 153 may be formed on the second semiconductor pattern 152. A length L1 of the planar portion of the lower surface 152_1s of the second semiconductor pattern 152 may be different from a length L2 of the planar portion of the lower surface 153_1s of the third semiconductor pattern 153. The length L1 of the planar portion of the lower surface 152_1s of the second semiconductor pattern 152 may be smaller than the length L2 of the planar portion of the lower surface 153_1s of the third semiconductor pattern 153.

Since the second semiconductor pattern 152 may be formed through a bottom up growth process, a thickness of the second semiconductor pattern 152 may not be constant. A thickness T2_1 of the second semiconductor pattern 152 on the planar portion of the lower portion 153_1 of the side surface 153_ss of the third semiconductor pattern 153 may be different from a thickness T2_2 of the second semiconductor pattern 152 on the lower surface 153_1s of the third semiconductor pattern 153. The thickness T2_1 of the second semiconductor pattern 152 on the planar portion of the lower portion 153_1 of the side surface 153_ss of the third semiconductor pattern 153 may be smaller than the thickness T2_2 of the second semiconductor pattern 152 on the lower surface 153_1s of the third semiconductor pattern 153. For example, in the process of forming the second semiconductor pattern 152 on the first semiconductor pattern 151, the growth on the bottom portion of the second semiconductor pattern 152 may be faster the growth on the side portion.

An upper surface 154_us of the fourth semiconductor pattern 154 may include a planar portion. At least a portion of the upper surface 154_us of the fourth semiconductor pattern 154 may be flat. The upper surface 154_us of the fourth semiconductor pattern 154 is illustrated as including an angled stepped portion, but the present disclosure is not limited thereto. For example, the upper surface 154_us of the fourth semiconductor pattern 154 may include a curved stepped portion. Further, unlike that illustrated in the drawing, the entire upper surface 154_us of the fourth semiconductor pattern 154 may be planar.

At least a portion of the upper surface 154_us of the fourth semiconductor pattern 154 may be disposed above an upper surface of the third sheet pattern NS1_3. Further, unlike that illustrated in the drawing, the entire upper surface 154_us of the fourth semiconductor pattern 154 may be disposed above the upper surface of the third sheet pattern NS1_3.

The thickness T2_2 of the second semiconductor pattern 152 in the third direction D3 may be different from a thickness T3 of the third semiconductor pattern 153 in the third direction D3. The thickness T2_2 of the second semiconductor pattern 152 in the third direction D3 may be smaller than the thickness T3 of the third semiconductor pattern 153 in the third direction D3.

The thickness T1_2 of the first semiconductor pattern 151 in the third direction D3, the thickness T2_2 of the second semiconductor pattern 152 in the third direction D3, the thickness T3 of the third semiconductor pattern 153 in the third direction D3, and a thickness T4 of the fourth semiconductor pattern 154 in the third direction D3 may be different from each other. Here, the thickness in the third direction D3 may mostly refer to a maximum thickness among the thicknesses. The thicknesses T1_2, T2_2, T3 and T4 may each refer to a thickness measured in the third direction D3 at the central portion in the first direction D1 of the respective first to fourth semiconductor patterns 151 to 154. For example, the thickness T4 of the fourth semiconductor pattern 154 in the third direction D3 may be greater than the thickness T3 of the third semiconductor pattern 153 in the third direction D3, the thickness T3 of the third semiconductor pattern 153 in the third direction D3 may be greater than the thickness T2_2 of the second semiconductor pattern 152 in the third direction D3, and the thickness T2_2 of the second semiconductor pattern 152 in the third direction D3 may be greater than the thickness T1_2 of the first semiconductor pattern 151 in the third direction D3. However, the present disclosure is not limited thereto, and the thicknesses T1_2, T2_2, T3, and T4 of the respective first to fourth semiconductor patterns 151 to 154 in the third direction D3 may have various relationships.

The first to fourth semiconductor patterns 151 to 154 may each include, for example, silicon-germanium (SiGe). The first to fourth semiconductor patterns 151 to 154 may include doped p-type impurities. For example, the first to fourth semiconductor patterns 151 to 154 may be formed in the PMOS region. For example, the p-type impurities may include boron (B), but the present disclosure is not limited thereto.

When each of the first to fourth semiconductor patterns 151 to 154 includes silicon-germanium (SiGe), germanium (Ge) fractions of the first to fourth semiconductor patterns 151 to 154 may be different from each other. The germanium (Ge) fraction of the fourth semiconductor pattern 154 may be greater than the germanium (Ge) fraction of the third semiconductor pattern 153, the germanium (Ge) fraction of the third semiconductor pattern 153 may be greater than the germanium (Ge) fraction of the second semiconductor pattern 152, and the germanium (Ge) fraction of the second semiconductor pattern 152 may be greater than the germanium (Ge) fraction of the first semiconductor pattern 151. For example, the germanium (Ge) concentration of the first semiconductor pattern 151 may be in a range from about 0% to about 30%, the germanium (Ge) concentration of the second semiconductor pattern 152 may be in a range from about 0% to about 40%, the germanium (Ge) concentration of the third semiconductor pattern 153 may be in a range from about 30% to about 60%, and the germanium (Ge) concentration of the fourth semiconductor pattern 154 may be in a range from about 30% to about 80%. In an exemplary embodiment of the present disclosure, the germanium (Ge) concentration of the second semiconductor pattern 152 layer may be in a range from about 3% to about 35% as an intermediate concentration (e.g., relatively low concentration) between the germanium (Ge) concentration (e.g., relatively low concentration) of the first semiconductor pattern 151 and the germanium (Ge) concentration (e.g., relatively high concentration) of the third semiconductor pattern 153. The germanium (Ge) concentrations described herein are based on atomic %.

The first source/drain pattern 150 may include a plurality of silicon-germanium (SiGe) layers, whose germanium (Ge) fractions increase as it moves away from the first lower pattern BP1, on the first lower pattern BP1. The first source/drain pattern 150 is illustrated as including four semiconductor patterns each containing silicon-germanium (SiGe) and being sequentially formed on the first lower pattern BP1, but the present disclosure is not limited thereto. Unlike that illustrated in the drawings, the first source/drain pattern 150 may include three or less semiconductor patterns each containing silicon-germanium (SiGe), or may include five or more semiconductor patterns each containing silicon-germanium (SiGe). For example, the first source/drain pattern 150 may be composed of three to seven semiconductor patterns with various boron (B) and germanium (Ge) concentrations.

The capping semiconductor pattern 155 may be disposed on the fourth semiconductor pattern 154. The capping semiconductor pattern 155 may be in contact with the fourth semiconductor pattern 154. Alternatively, unlike that illustrated in the drawings, the first source/drain pattern 150 may not include the capping semiconductor pattern 155.

The capping semiconductor pattern 155 may include, for example, silicon (Si). Alternatively, the capping semiconductor pattern 155 may include, for example, silicon-germanium (SiGe). When the capping semiconductor pattern 155 includes silicon-germanium (SiGe), a germanium (Ge) fraction of the capping semiconductor pattern 155 may be less than the germanium (Ge) fraction of the first semiconductor pattern 151, but the present disclosure is not limited thereto. The capping semiconductor pattern 155 may include doped p-type impurities (e.g., B), but the present disclosure is not limited thereto.

An etch stop layer 185 may be disposed on a sidewall of the first gate structure GS1, an upper surface of the first source/drain pattern 150, and a sidewall of the first source/drain pattern 150. Also, the etch stop layer 185 may be disposed on the upper surface of the field insulating layer 105 (see FIG. 5).

The etch stop layer 185 may include a material having an etch selectivity with respect to the interlayer insulating layer 190 to be described below. The etch stop layer 185 may include at least one of, for example, silicon nitride ($Si_3N_4$), silicon carbonitride (SiCN), silicon oxynitride (SiON), silicon oxycarbonitride (SiOCN), silicon boron nitride (SiBN), silicon boron carbonitride (SiBCN), silicon oxyboron nitride (SiOBN), silicon oxycarbide (SiOC), or a combination thereof.

The interlayer insulating layer 190 may be disposed on the etch stop layer 185, and may be disposed on the first source/drain pattern 150. The interlayer insulating layer 190 may not cover the upper surface of the first gate capping pattern 145. For example, the upper surface of the interlayer insulating layer 190 may be coplanar with the upper surface of the first gate capping pattern 145.

The interlayer insulating layer 190 may include at least one of silicon oxide ($SiO_2$), silicon nitride ($Si_3N_4$), silicon oxynitride (SiON), or a low dielectric constant (low-k) material. For example, the low-k material may include, for example, fluorinated tetraethyl orthosilicate (FTEOS), hydrogen silsesquioxane (HSQ), bis-benzocyclobutene (BCB), tetramethyl orthosilicate (TMOS), octamethylcyclotetrasiloxane (OMCTS), hexamethyl disiloxane (HMDS), trimethylsilyl borate (TMSB), diacetoxyditertiarybutosiloxane (DADBS), trimethylsilil phosphate (TMSP), polytetrafluoroethylene (PTFE), tonen silazene (TOSZ), fluoride silicate glass (FSG), polyimide nanofoams (e.g., polypropylene oxide), carbon-doped silicon oxide (CDO), organo silicate glass (OSG), SiLK, amorphous fluorinated carbon, silica aerogels, silica xerogels, mesoporous silica, or a combination thereof, but the present disclosure is not limited thereto.

Figure 8:
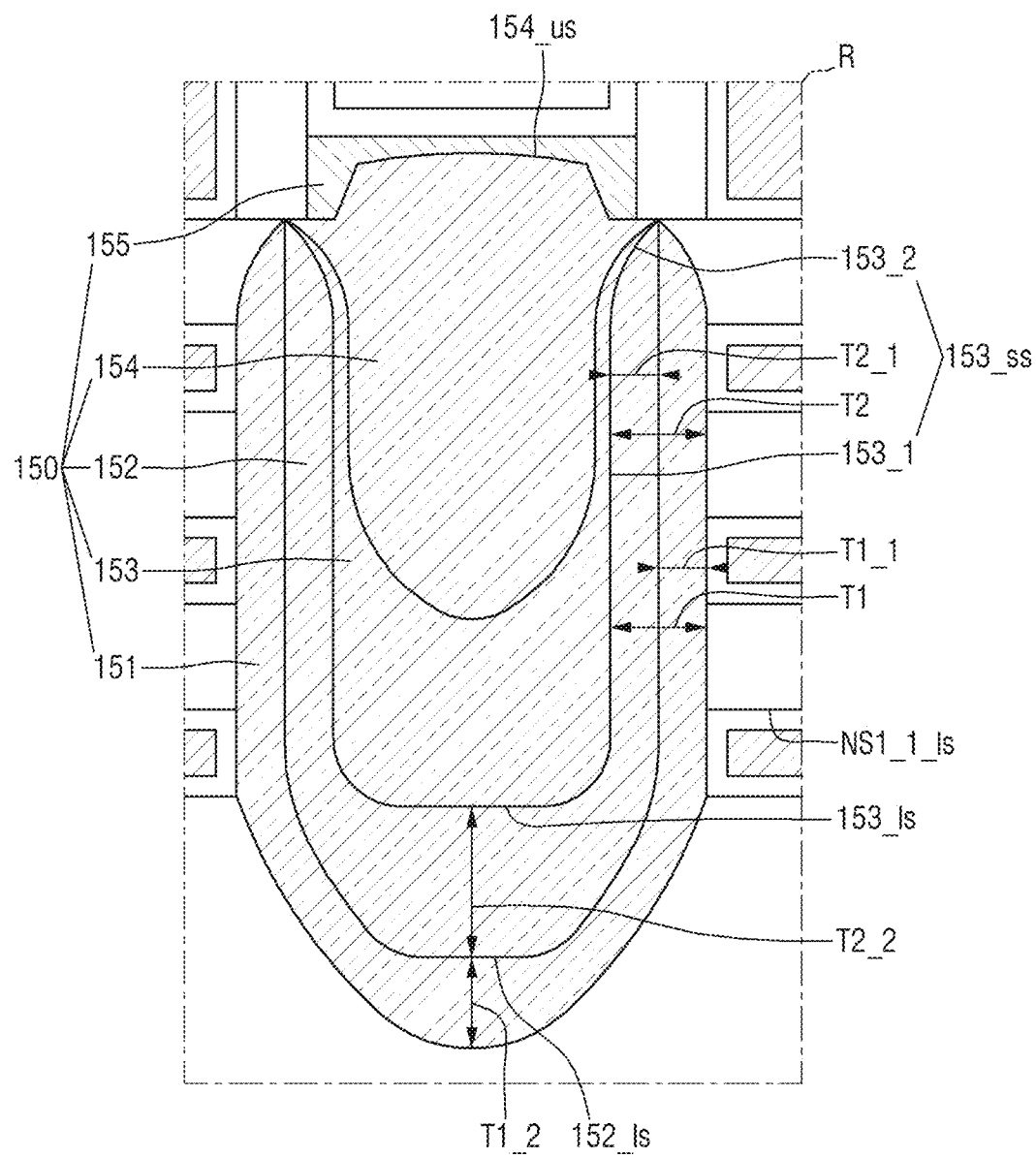
FIGS. 8 and 9 are views for describing a semiconductor device each according to an exemplary embodiment of the present disclosure.
Figure 9:
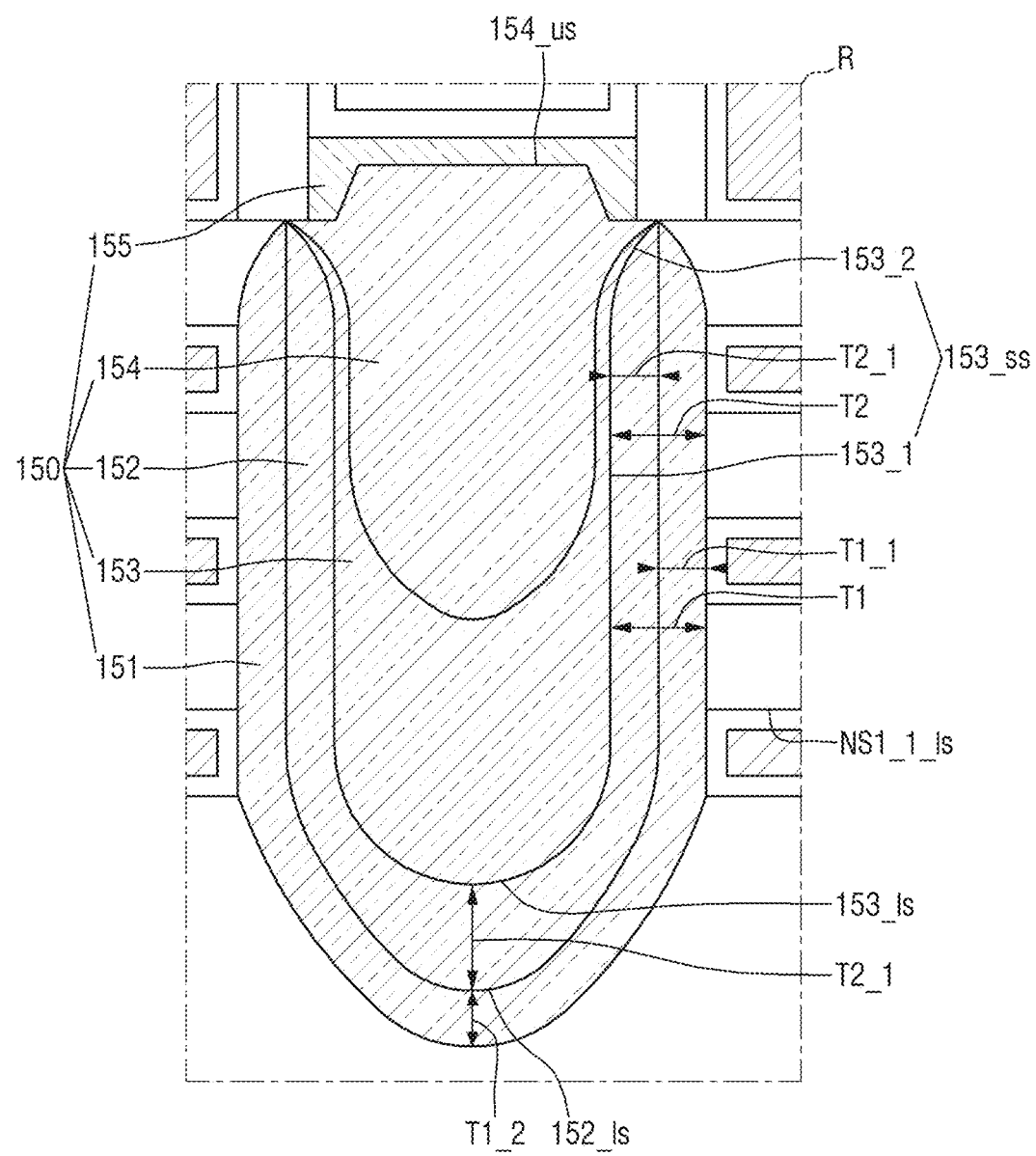

FIGS. 8 and 9 are views for describing a semiconductor device each according to an exemplary embodiment of the present disclosure. For reference, FIGS. 8 and 9 are enlarged views of region R of FIG. 2. For convenience of description, differences from those described with reference to FIGS. 1 to 7 will be mainly described.

Referring to FIG. 8, in the semiconductor device according to an exemplary embodiment of the present disclosure, an upper surface 154_us of a fourth semiconductor pattern 154 may include an upwardly convex portion. The upper surface 154_us of the fourth semiconductor pattern 154 is illustrated as including an angled stepped portion, but the present disclosure is not limited thereto. For example, the upper surface 154_us of the fourth semiconductor pattern 154 may include a curved stepped portion. The lowermost portion of the upper surface 154_us of the fourth semiconductor pattern 154 may be located at a level the same as that of an upper surface of a third sheet pattern NS1_3. Further, unlike that illustrated in the drawing, the entire upper surface 154_us of the fourth semiconductor pattern 154 may be convex upward, and may be disposed above the upper surface of the third sheet pattern NS1_3.

Referring to FIG. 9, in the semiconductor device according to an exemplary embodiment of the present disclosure, a lower surface 153_1s of a third semiconductor pattern 153 may include a downwardly convex portion. For example, the entire lower surface 153_1s of the third semiconductor pattern 153 may be convex downward.

A lower surface 152_1s of a second semiconductor pattern 152 may include a downwardly convex portion. For example, the entire lower surface 152_1s of the second semiconductor pattern 152 may be convex downward.

The thickness of a first semiconductor pattern 151 may be constant. A thickness T1_1 of the first semiconductor pattern 151 on a planar portion of a lower portion 153_1 of a side surface 153_ss of the third semiconductor pattern 153 may be substantially equal to a thickness T1_2 of the first semiconductor pattern 151 on the lower surface 153_1s of the third semiconductor pattern 153. Alternatively, the thickness T1_1 of the first semiconductor pattern 151 on the planar portion of the lower portion 153_1 of the side surface 153_ss of the third semiconductor pattern 153 may be greater than the thickness T1_2 of the first semiconductor pattern 151 on the lower surface 153_1s of the third semiconductor pattern 153. Similar to FIG. 8, in FIG. 9, the planar portion of the lower portion 153_1 of the side surface 153_ss of the third semiconductor pattern 153 may overlap all of each of the first and second sheet patterns NS1_1 and NS1_2 and a part of the third sheet pattern NS1_3 in the first direction D1, and the upper portion 153_2 of the side surface 153_ss of the third semiconductor pattern 153 may overlap a portion of the third sheet pattern NS1_3 in the first direction D1. Accordingly, a flat junction profile may be applied equally to the first to third sheet patterns NS1_1 to NS1_3 which are used as a channel region. Thus, compressive stress may be homogeneously applied to the first sheet pattern NS1_1 as well as the second and third sheet patterns NS1_2 and NS1_3 from the first source/drain pattern 150, thereby enhancing the mobility of electric charges.

FIG. 10 is a view for describing a semiconductor device according to an exemplary embodiment of the present disclosure. FIG. 10 is a cross-sectional view taken along line C-C of FIG. 1. For convenience of description, differences from those described with reference to FIGS. 1 to 7 will be mainly described.

Referring to FIG. 10, the semiconductor device according to an exemplary embodiment of the present disclosure may further include a fin spacer 104.

The fin spacer 104 may be formed on a sidewall of a first lower pattern BP1, which protrudes further than an upper surface of a field insulating layer 105. The fin spacer 104 may be formed on a partial sidewall of a lower portion of a first source/drain pattern 150. The fin spacer 104 may be in contact with a portion of a first semiconductor pattern 151. However, the present disclosure is not limited thereto. For example, unlike that illustrated in the drawing, a portion of the first lower pattern BP1 may protrude above the fin spacer 104. That is, a lower portion of the sidewall of the first lower pattern BP1 may be covered by the fin spacer 104, and an upper portion of the sidewall of the first lower pattern BP1 may not be covered by the fin spacer 104.

The fin spacer 104 may include, for example, at least one of silicon nitride ($Si_3N_4$), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), or a combination thereof.

An etch stop layer 185 may be disposed on an upper surface of the first source/drain pattern 150, a sidewall of the first source/drain pattern 150, an outer side surface of the fin spacer 104, and an upper surface of the field insulating layer 105.

Figure 11:
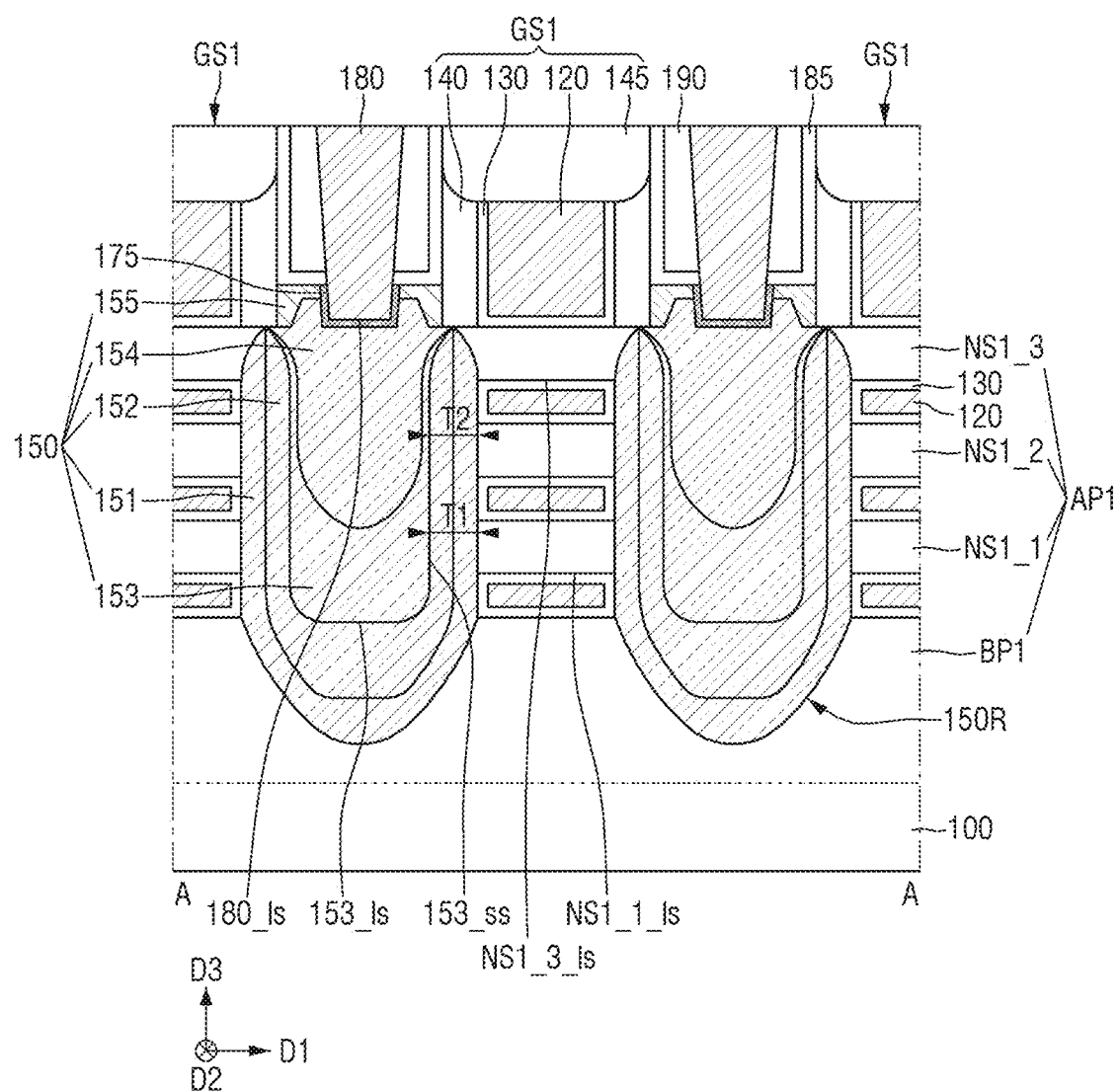
FIGS. 11 and 12 are views each for describing a semiconductor device according to an exemplary embodiment of the present disclosure.
Figure 12:
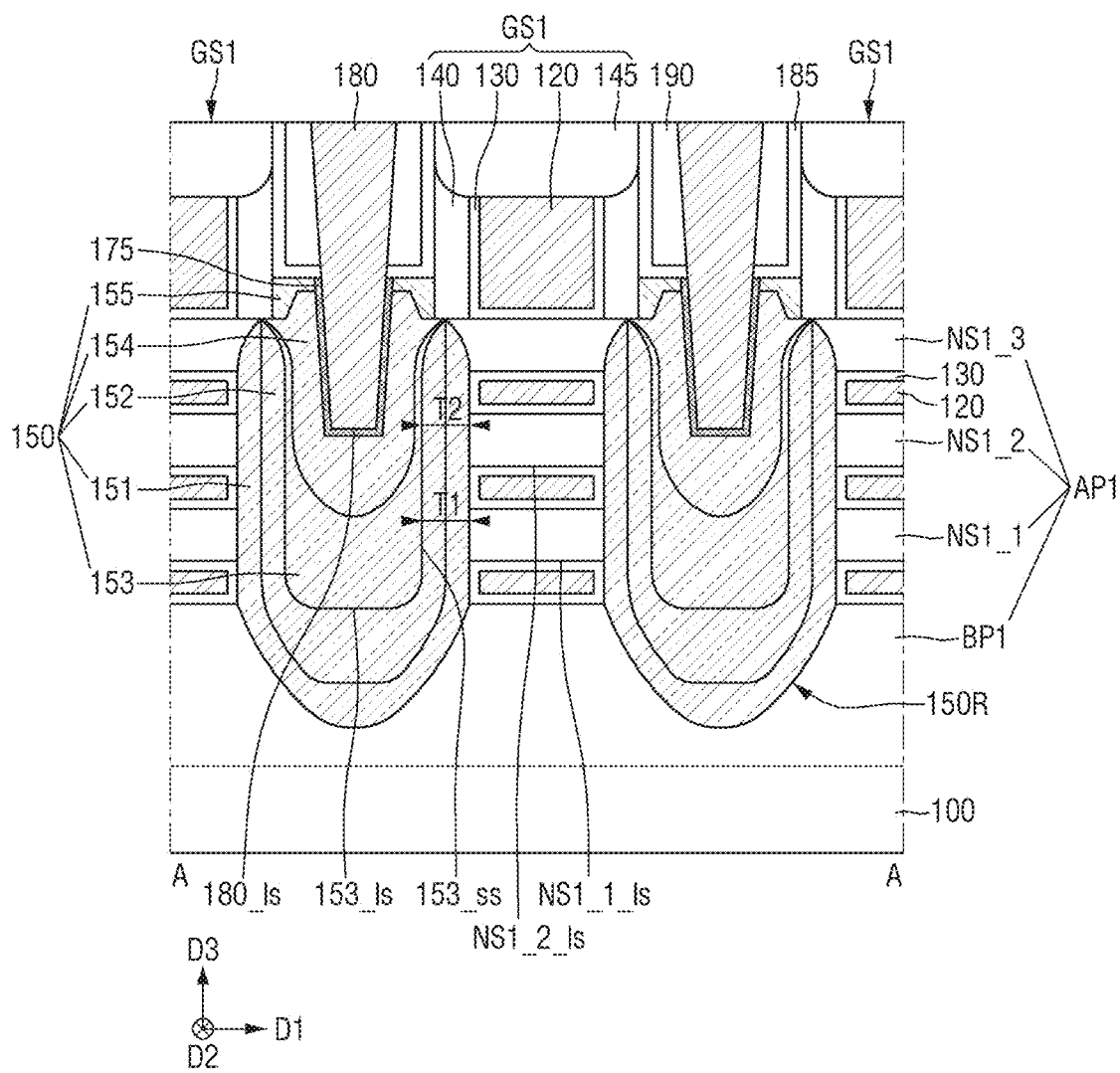

FIGS. 11 and 12 are views each for describing a semiconductor device according to an exemplary embodiment of the present disclosure. For reference, FIGS. 11 and 12 are cross-sectional views taken along line A-A of FIG. 1. For convenience of description, differences from those described with reference to FIGS. 1 to 7 will be mainly described.

Referring to FIGS. 11 and 12, the semiconductor device according to an exemplary embodiment of the present disclosure may further include a source/drain contact 180 disposed on a first source/drain pattern 150.

The source/drain contact 180 may be connected to the first source/drain pattern 150. For example, the source/drain contact 180 may be connected to the first source/drain pattern 150 through an interlayer insulating layer 190 and an etch stop layer 185. A bottom surface 180_1s of the source/drain contact 180 may be disposed in a fourth semiconductor pattern 154.

A metal silicide layer 175, for providing low contact resistance, may be further disposed between the source/drain contact 180 and the first source/drain pattern 150. The metal silicide layer 175 may include a metal silicide such as, for example, nickel silicide ($NiSi_2$), titanium silicide ($TiSi_2$), tungsten silicide ($WSi_2$), or cobalt silicide ($CoSi_2$), but the present disclosure is not limited thereto. Thus, the source/drain contact 180 may be connected to the first source/drain pattern 150 via the metal silicide layer 175.

Referring to FIG. 11, the bottom surface 180_1s of the source/drain contact 180 may be disposed above a lower surface NS1_3_1s of a third sheet pattern NS1_3.

Referring to FIG. 12, the bottom surface 180_1s of the source/drain contact 180 may be disposed above a lower surface NS1_2_1s of a second sheet pattern NS1_2.

The source/drain contact 180 is illustrated as being a single layer, but this is only for convenience of description, and the present disclosure is not limited thereto. The source/drain contact 180 may include at least one of, for example, a metal, a metal alloy, a conductive metal nitride, a conductive metal carbide, a conductive metal oxide, a conductive metal carbonitride, or a 2D material. For example, the source/drain contact 180 may include, for example, tungsten (W), copper (Cu), aluminum (Al), titanium (Ti), tantalum (Ta), titanium nitride (TiN), tantalum nitride (TaN), an alloy thereof, or a combination thereof. However, the present disclosure is not limited thereto.

Figure 13:
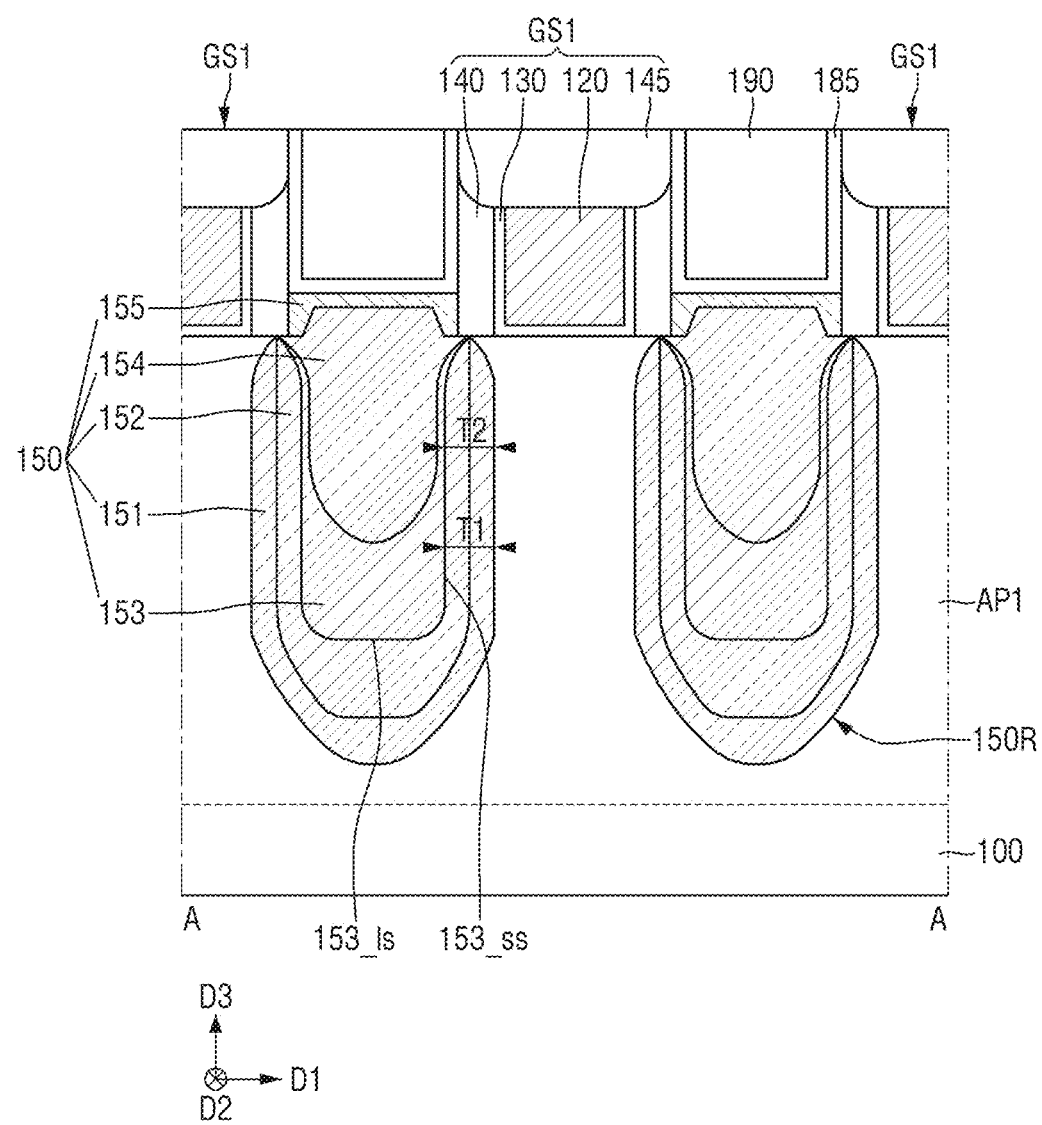
FIGS. 13 and 14 are views for describing a semiconductor device according to an exemplary embodiment of the present disclosure.
Figure 14:
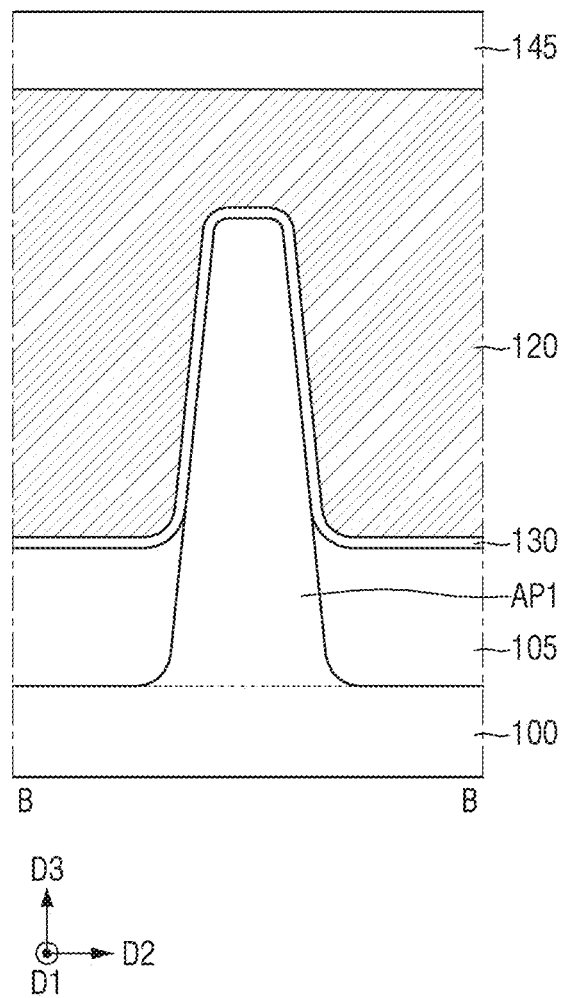

FIGS. 13 and 14 are views for describing a semiconductor device according to an exemplary embodiment of the present disclosure. For reference, FIG. 13 is a cross-sectional view taken along line A-A of FIG. 1, and FIG. 14 is a cross-sectional view taken along line B-B of FIG. 1. For convenience of description, differences from those described with reference to FIGS. 1 to 7 will be mainly described.

Referring to FIGS. 13 and 14, in the semiconductor device according to an exemplary embodiment of the present disclosure, a first active pattern AP1 may be a fin-type pattern.

A portion of the first active pattern AP1 may protrude further than an upper surface of a field insulating layer 105 in the third direction D3. A first gate insulating layer 130 may extend along a profile of the first active pattern AP1 protruding further than the upper surface of the field insulating layer 105.

Figure 15:
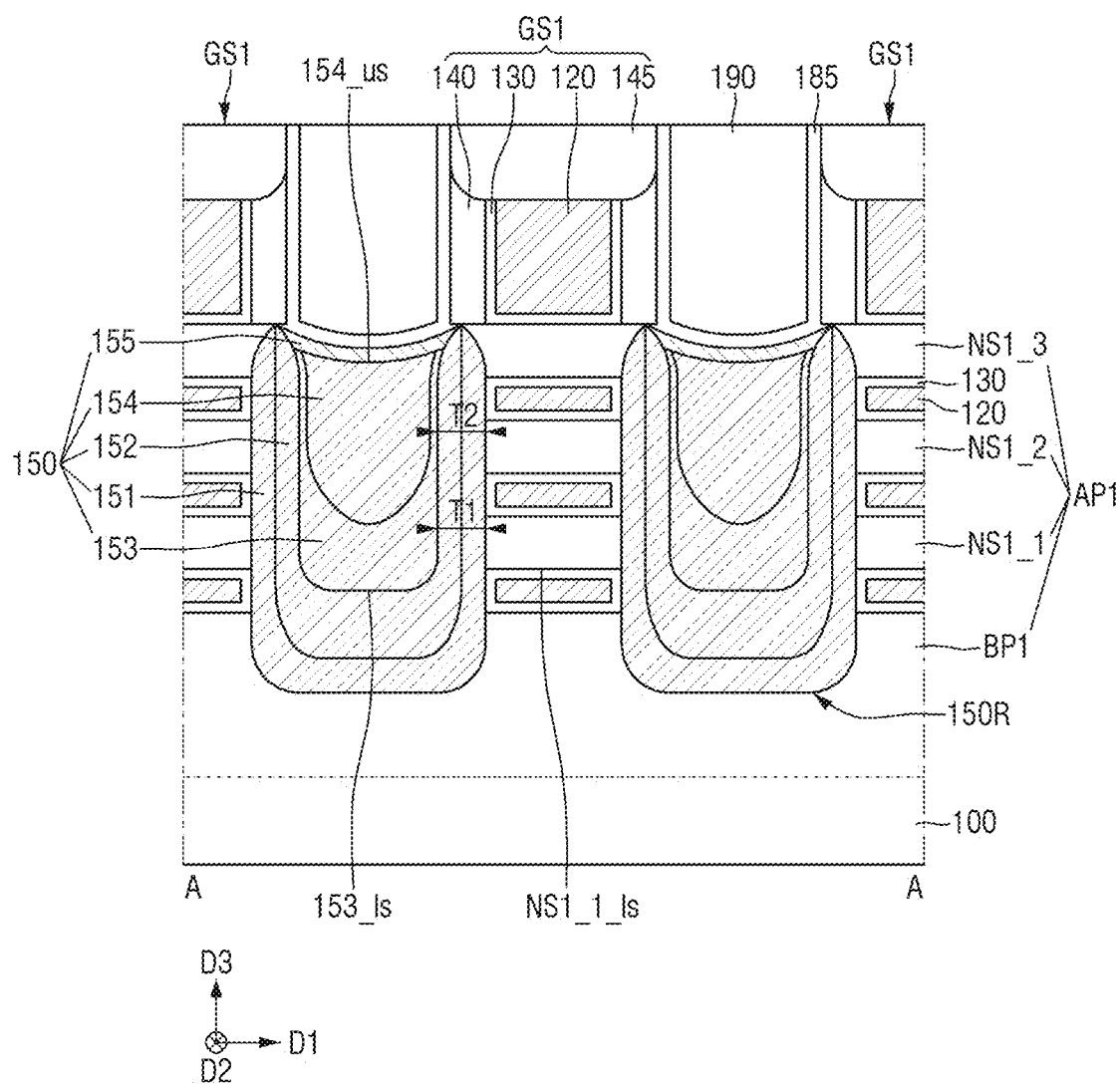
FIGS. 15 to 17 are views each for describing a semiconductor device according to an exemplary embodiment of the present disclosure.
Figure 16:
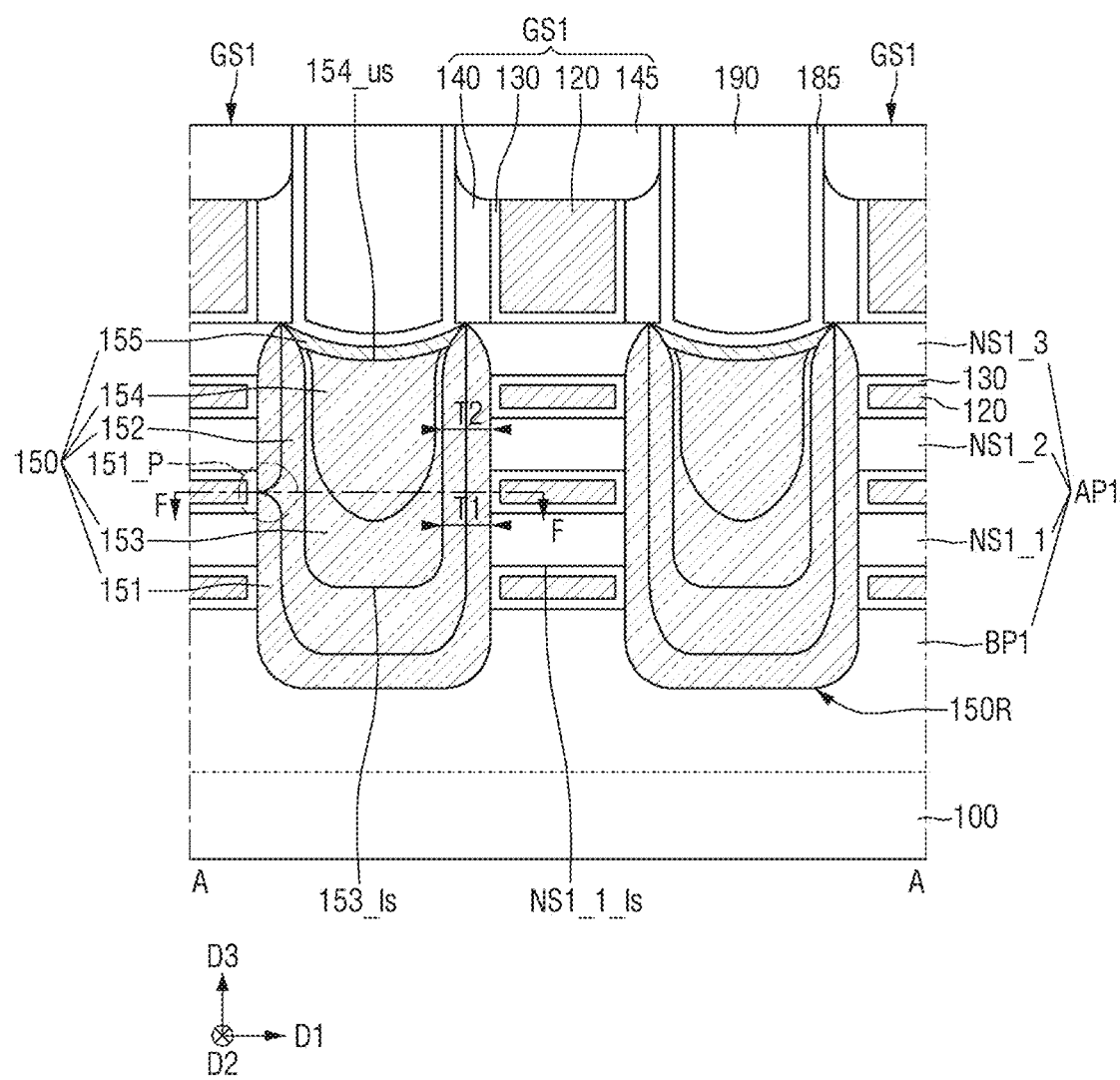
Figure 17:
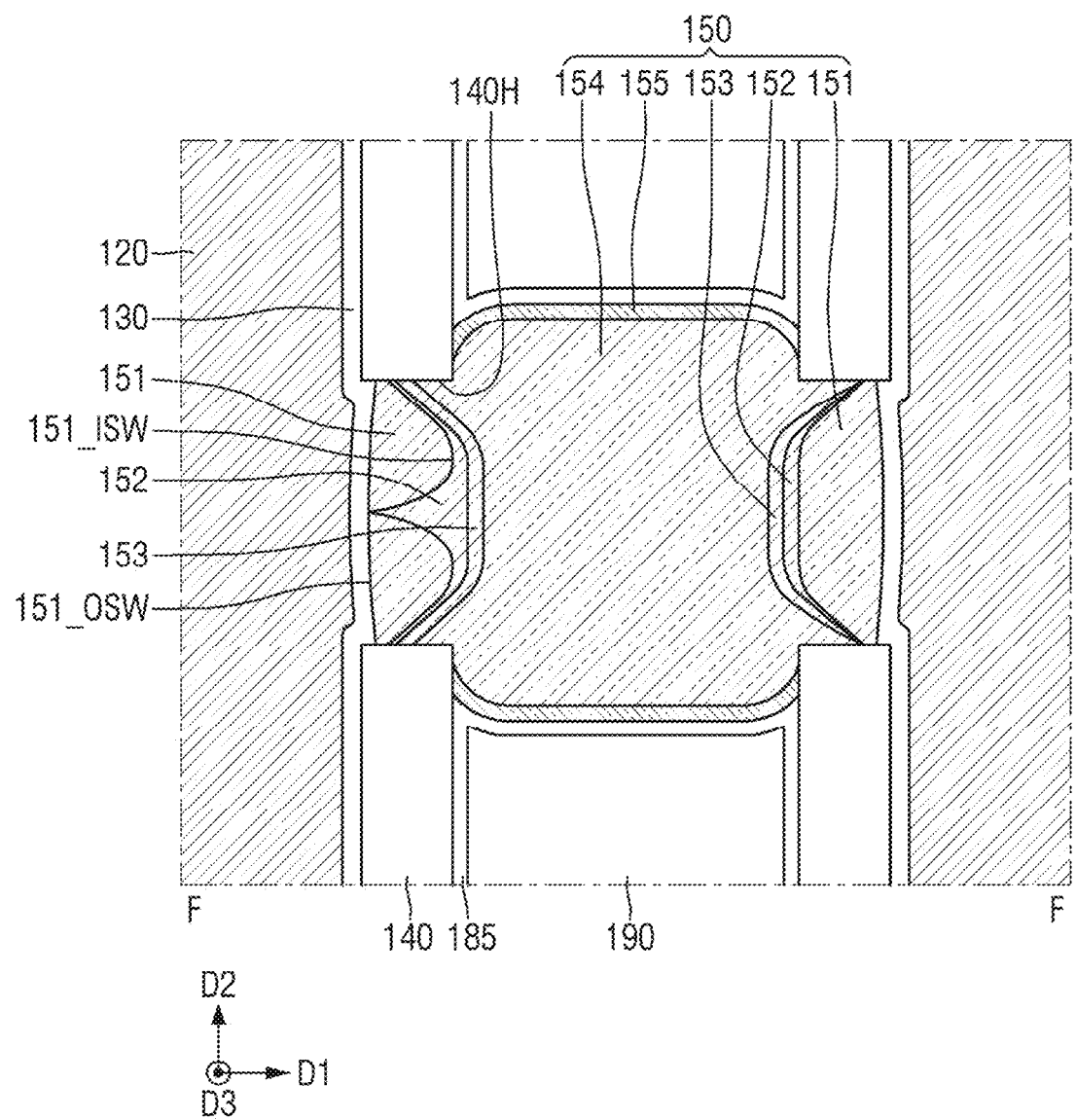

FIGS. 15 to 17 are views each for describing a semiconductor device according to an exemplary embodiment of the present disclosure. For reference, FIGS. 15 and 16 are cross-sectional views taken along line A-A of FIG. 1, and FIG. 17 is a cross-sectional view taken along line F-F of FIG. 16. For convenience of description, differences from those described with reference to FIGS. 1 to 7 will be mainly described.

Referring to FIGS. 15 and 16, in the semiconductor device according to an exemplary embodiment of the present disclosure, a bottom surface of a first source/drain recess 150R may include a planar portion. The planar portion of the bottom surface of the first source/drain recess 150R may be defined by a first lower pattern BP1. The planar portion of the bottom surface of the first source/drain recess 150R may overlap a planar portion of a lower surface of a second semiconductor pattern 152 and a planar portion of a lower surface of a third semiconductor pattern 153 in the third direction D3. The length of the planar portion of the bottom surface of the first source/drain recess 150R may be greater than the length of the planar portion of the lower surface of the second semiconductor pattern 152 and the length of the planar portion of the lower surface of the third semiconductor pattern 153.

The width of the first source/drain recess 150R, which is defined by the first lower pattern BP1, in the first direction D1 may be increased and then constant as it moves away from the first lower pattern BP1. For example, the width of the first source/drain recess 150R in the first direction D1 may increase and then become constant as it moves away from the substrate 100 in the third direction D3.

An upper surface 154_us of a fourth semiconductor pattern 154 may include a downwardly convex portion. The upper surface 154_us of the fourth semiconductor pattern 154 may be disposed below an upper surface of a third sheet pattern NS1_3, and may be disposed above an upper surface of a second sheet pattern NS1_2.

A capping semiconductor pattern 155 may be disposed on the fourth semiconductor pattern 154. An upper surface of the capping semiconductor pattern 155 may include a downwardly convex portion. The capping semiconductor pattern 155 may be disposed below the upper surface of the third sheet pattern NS1_3. Similar to FIG. 8, in FIG. 15, the planar portion of the side surface of the third semiconductor pattern 153 may overlap all of each of the first and second sheet patterns NS1_1 and NS1_2 and a part of the third sheet pattern NS1_3 in the first direction D1. Accordingly, a flat junction profile may be applied equally to the first to third sheet patterns NS1_1 to NS1_3 which are used as a channel region. Thus, compressive stress may be homogeneously applied to the first sheet pattern NS1_1 as well as the second and third sheet patterns NS1_2 and NS1_3 from the first source/drain pattern 150, thereby enhancing the mobility of electric charges.

Referring to FIGS. 16 and 17, a side surface of a first semiconductor pattern 151, which is a boundary between the first semiconductor pattern 151 and the second semiconductor pattern 152, may include a pinning region 151_P. In the pinning region 151_P, a thickness of the first semiconductor pattern 151 may decrease suddenly on a planar portion of a side surface 153_ss of the third semiconductor pattern 153. In the pinning region 151_P, the thickness of the first semiconductor pattern 151 on the planar portion of the side surface 153_ss of the third semiconductor pattern 153 may decrease and then increase as it moves away from the first lower pattern BP1.

In the pinning region 151_P, an inner side surface 151_ISW of the first semiconductor pattern 151, which is a boundary between the first semiconductor pattern 151 and the second semiconductor pattern 152, may include a portion indented toward an outer side surface 151_OSW of the first semiconductor pattern 151, which is a boundary between the first semiconductor pattern 151 and a first gate insulating layer 130.

In the pinning region 151_P, the inner side surface 151_ISW of the first semiconductor pattern 151 may meet the outer side surface 151_OSW of the first semiconductor pattern 151. Accordingly, the first semiconductor pattern 151 may be separated into two portions with respect to the pinning region 151_P. Alternatively, unlike that illustrated in the drawing, in the pinning region 151_P, the inner side surface 151_ISW of the first semiconductor pattern 151 is spaced apart from the outer side surface 151_OSW of the first semiconductor pattern 151 in the first direction D1, and may include concave portions in the first direction D1.

The pinning region 151_P is illustrated as overlapping a first gate electrode 120, which is disposed between the first lower pattern BP1 and first to third sheet patterns NS1_1 to NS1_3, in the first direction D1, but the present disclosure is not limited thereto. Further, it is illustrated in the drawing that one first semiconductor pattern 151 includes one pinning region 151_P, but the present disclosure is not limited thereto. For example, one first semiconductor pattern 151 may include a plurality of pinning regions 151_P.

A portion of a first source/drain pattern 150 may include the pinning region 151_P and the remaining portion of the first source/drain pattern 150 may not include the pinning region 151_P, but the present disclosure is not limited thereto.

Figure 18:
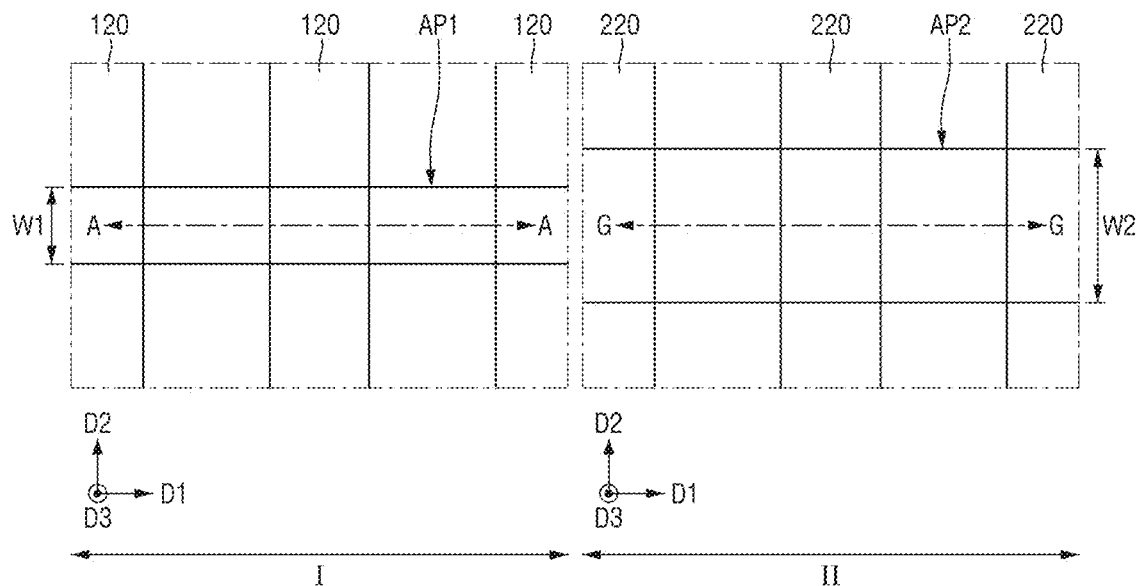
FIG. 18 is an exemplary layout diagram for describing a semiconductor device according to an exemplary embodiment of the present disclosure.

FIG. 18 is an exemplary layout diagram for describing a semiconductor device according to an exemplary embodiment of the present disclosure.

For reference, FIG. 2 may be a cross-sectional view taken along line A-A of FIG. 18. The cross-sectional view taken along line G-G of FIG. 18 may be the same as one of FIGS. 15 and 16. A description of a first region I of FIG. 18 may be substantially the same as that described with reference to FIGS. 1 to 10. A description of a second region II of FIG. 18 may be the same as that described with reference to FIGS. 15 and 16. A second gate electrode 220 and a second active pattern AP2 of FIG. 18 may correspond to the first gate electrode 120 and the first active pattern AP1 of FIGS. 15 and 16, respectively.

Referring to FIG. 18, the semiconductor device according to an exemplary embodiment of the present disclosure may include a first active pattern AP1, a plurality of first gate electrodes 120, the second active pattern AP2, and a plurality of second gate electrodes 220.

A substrate 100 may include the first region I and the second region II. The first active pattern AP1 and the plurality of first gate electrodes 120 may be disposed in the first region I of the substrate 100. The second active pattern AP2 and the plurality of second gate electrodes 220 may be disposed in the second region II of the substrate 100.

A width W1 of a first gate structure GS1 in the second direction D2 may be smaller than a width W2 of a second gate structure GS2 in the second direction D2. In other words, the width W1 of the first active pattern AP1 in the second direction D2 may be smaller than the width W2 of the second active pattern AP2 in the second direction D2.

Figure 19:
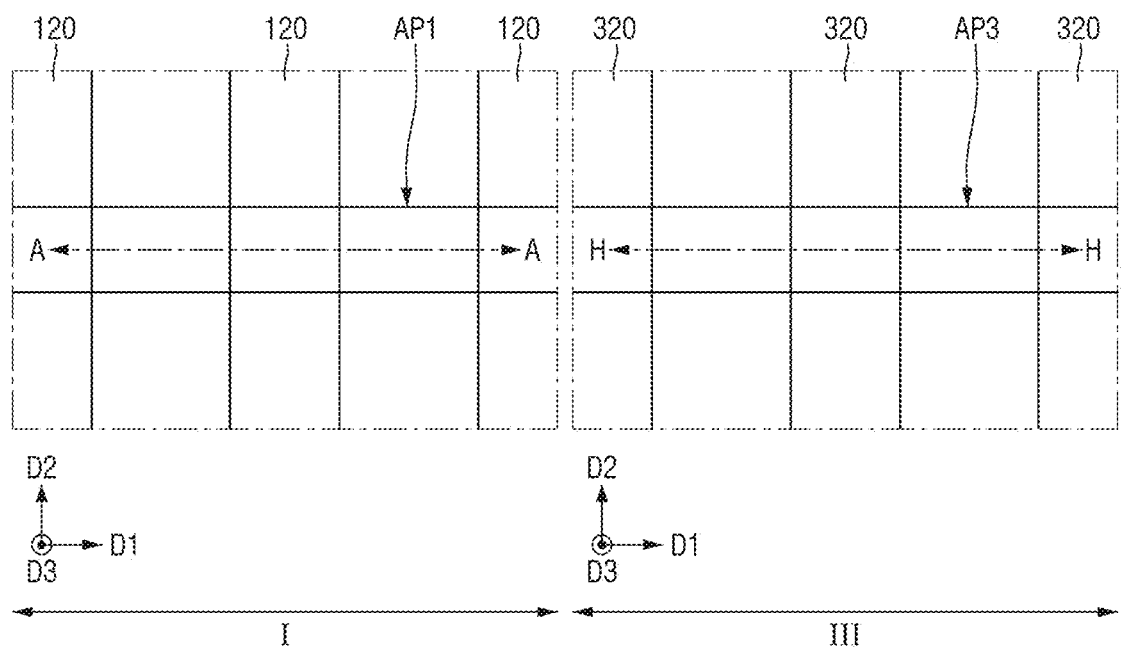
FIG. 19 is an exemplary layout diagram for describing a semiconductor device according to an exemplary embodiment of the present disclosure.
Figure 20:
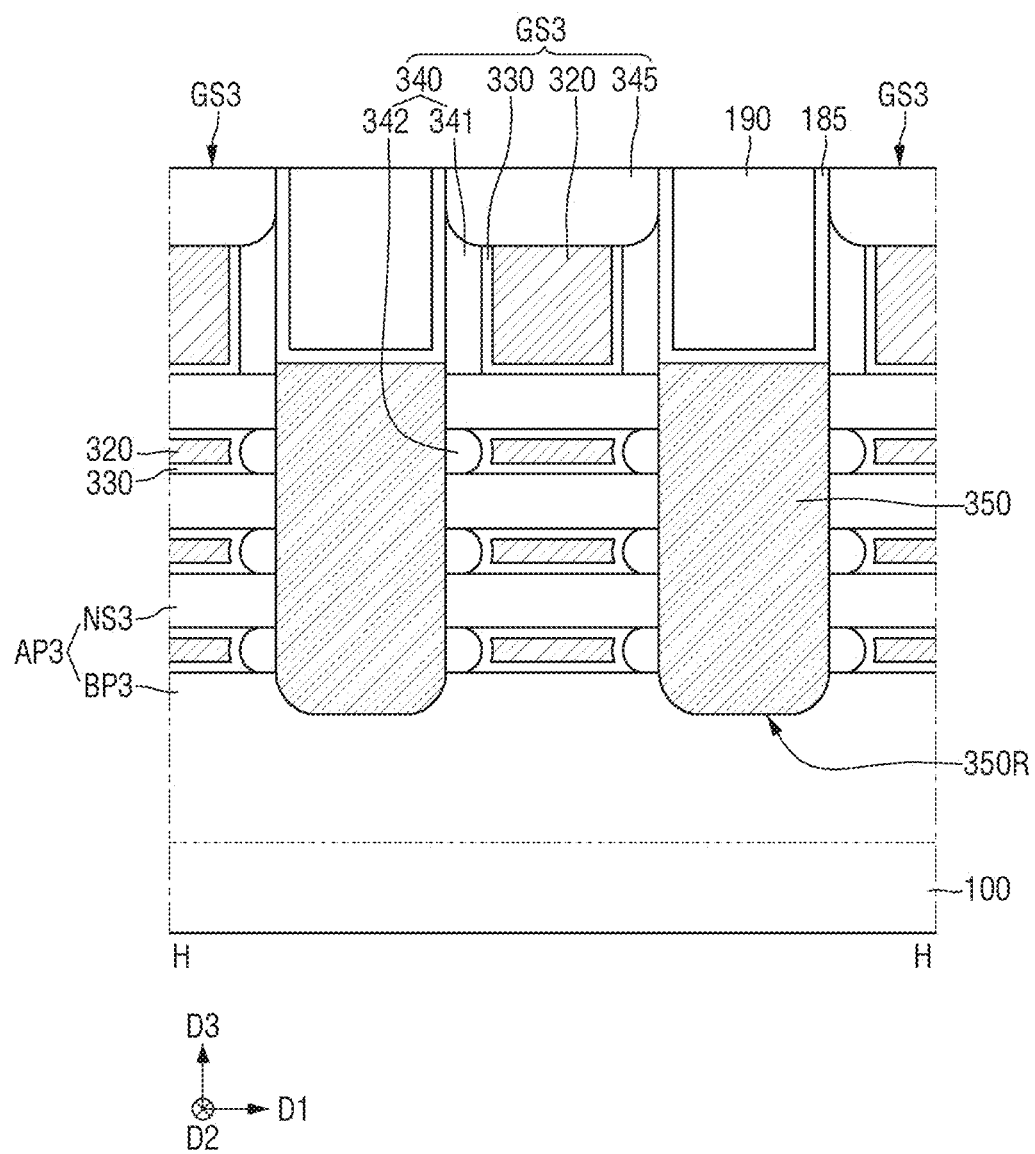
FIGS. 20 and 21 are cross-sectional views taken along line H-H of FIG. 19.
Figure 21:
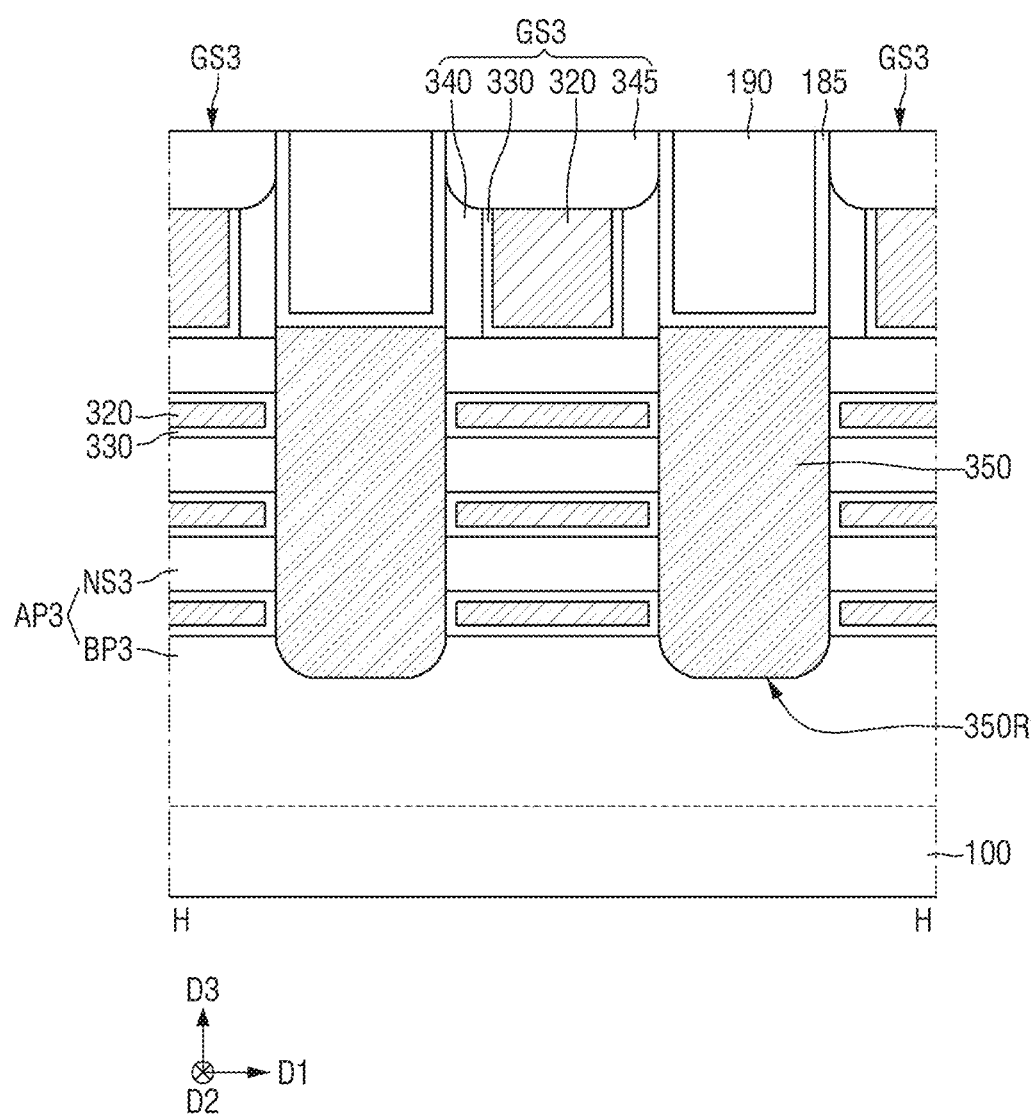

FIG. 19 is an exemplary layout diagram for describing a semiconductor device according to an exemplary embodiment of the present disclosure. FIGS. 20 and 21 are cross-sectional views taken along line H-H of FIG. 19.

For reference, FIG. 2 may be a cross-sectional view taken along line A-A of FIG. 19. A description of the first region I of FIG. 19 may be the same as that described with reference to FIGS. 1 to 10. Thus, the following description will be made focusing on contents of a third region III of FIG. 19.

Referring to FIGS. 19 to 21, the semiconductor device according to an exemplary embodiment of the present disclosure may include a first active pattern AP1, a plurality of first gate structures GS1, a first source/drain pattern 150, a third active pattern AP3, a plurality of third gate structures GS3, and a third source/drain pattern 350.

A substrate 100 may include a first region I and a third region III. The first region I may be a region in which a PMOS is formed, and the third region III may be a region in which an n-type metal-oxide-semiconductor (NMOS) is formed.

The first active pattern AP1, the plurality of first gate structures GS1, and the first source/drain pattern 150 may be disposed in the first region I of the substrate 100. The third active pattern AP3, the plurality of third gate structures GS3, and the third source/drain pattern 350 may be disposed in the third region III of the substrate 100.

The third active pattern AP3 may include a third lower pattern BP3 and a plurality of third region sheet patterns NS3. The third lower pattern BP3 may protrude from the substrate 100, and may be elongated in the first direction D1. The plurality of third region sheet patterns NS3 may be disposed on the third lower pattern BP3. The plurality of third region sheet patterns NS3 may be spaced apart from the third lower pattern BP3 in the third direction D3.

Each of the third lower pattern BP3 and the third region sheet patterns NS3 may include one of silicon (Si) or germanium (Ge), which is an elemental semiconductor material, a group IV-IV compound semiconductor, and/or a group III-V compound semiconductor. In the semiconductor device according to an exemplary embodiment of the present disclosure, the third lower pattern BP3 may be a silicon lower pattern including silicon (Si), and the third region sheet pattern NS3 may be a silicon sheet pattern including silicon (Si).

The plurality of third gate structures GS3 may be disposed on the substrate 100. Each of the third gate structures GS3 may extend in the second direction D2. The adjacent third gate structures GS3 may be spaced apart from each other in the first direction D1.

The third gate structures GS3 may be disposed on the third active pattern AP3, and may intersect the third active pattern AP3. The third gate structures GS3 may intersect the third lower pattern BP3, and may surround the respective third region sheet patterns NS3.

The third gate structure GS3 may include, for example, a third gate electrode 320, a third gate insulating layer 330, a third gate spacer 340, and a third gate capping pattern 345.

In FIG. 20, the third gate spacer 340 may include an outer spacer 341 and an inner spacer 342, unlike the first gate spacer 140. The inner spacer 342 may be disposed between the third region sheet patterns NS3 adjacent to each other in the third direction D3. The inner spacer 342 may be in contact with the third gate insulating layer 330. The inner spacer 342 may define a portion of a third source/drain recess 350R.

In FIG. 21, the third gate spacer 340 may not include an inner spacer like the first gate spacer 140. That is, the third gate insulating layer 330 may be in contact with the third source/drain pattern 350.

Descriptions of the third gate electrode 320, the third gate insulating layer 330, the third gate spacer 340, and the third gate capping pattern 345 are substantially the same as those of the first gate electrode 120, the first gate insulating layer 130, the first gate spacer 140, and the first gate capping pattern 145, and thus will be omitted in the following description.

The third source/drain pattern 350 may be formed on the third active pattern AP3. The third source/drain pattern 350 may be connected to the third region sheet pattern NS3.

The third source/drain pattern 350 may be disposed on a side surface of the third gate structure GS3. The third source/drain pattern 350 may be disposed between the third gate structures GS3 adjacent to each other in the first direction D1. For example, the third source/drain patterns 350 may be disposed on both sides of the third gate structure GS3. However, the present disclosure is not limited thereto. For example, unlike that illustrated in the drawings, the third source/drain pattern 350 may be disposed on one side of the third gate structure GS3 and may not be disposed on the other side of the third gate structure GS3.

The third source/drain pattern 350 may be included in a source/drain of a transistor using the third region sheet pattern NS3 as a channel region.

The third source/drain pattern 350 may be disposed in the third source/drain recess 350R. A bottom surface of the third source/drain recess 350R may be defined by the third lower pattern BP3. A sidewall of the third source/drain recess 350R may be defined by the third region sheet pattern NS3 and the third gate structure GS3.

The third source/drain pattern 350 may include silicon (Si) doped with n-type impurities. The n-type impurities may include, for example, phosphorus (P), arsenic (As), or antimony (Sb), but the present disclosure is not limited thereto.

When the third source/drain pattern 350 is in contact with the third gate insulating layer 330 as shown in FIG. 21, unlike that described above, the third source/drain pattern 350 may include a silicon-germanium (SiGe) liner extending along a profile of the third source/drain recess 350R. The third source/drain pattern 350 may include silicon (Si) doped with n-type impurities on the silicon-germanium (SiGe) liner.

FIGS. 22 to 26 are views for describing intermediate operations of a method of manufacturing a semiconductor device according to an exemplary embodiment of the present disclosure. For reference, FIGS. 22 to 26 may be cross-sectional views taken along line A-A of FIG. 1.

Figure 22:
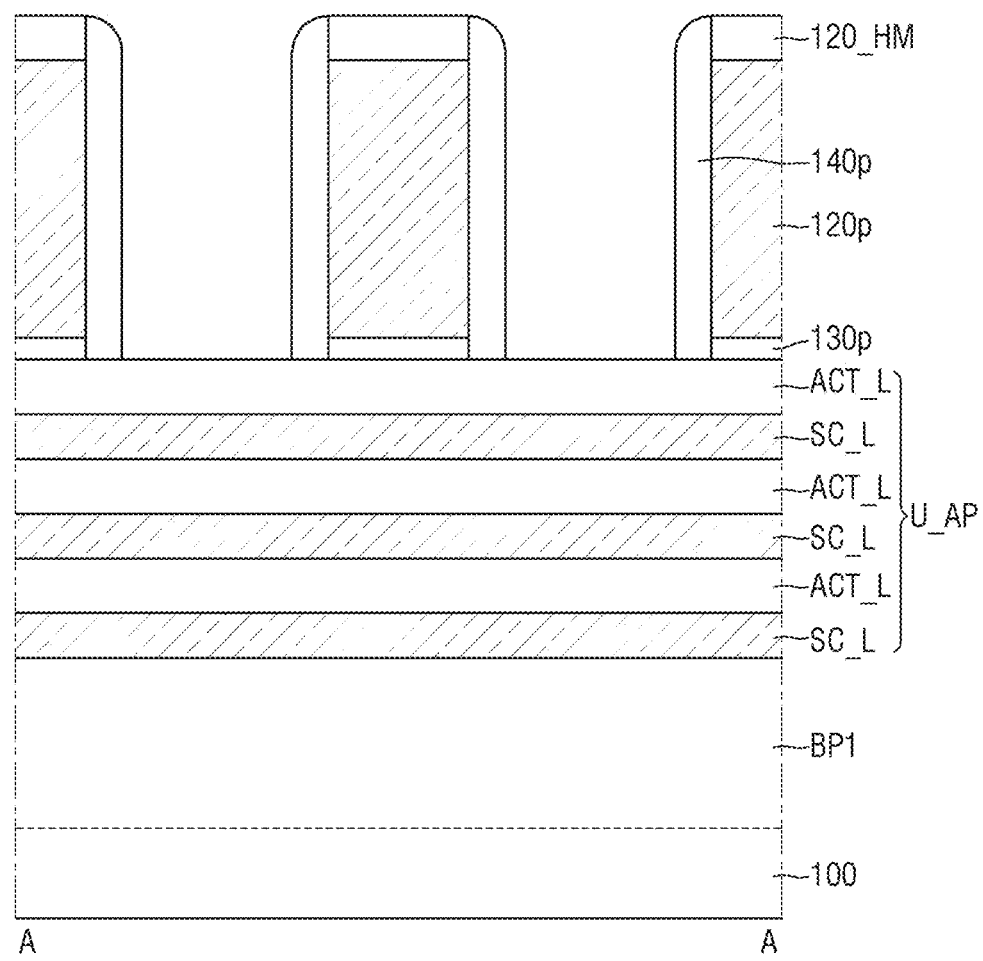
FIGS. 22 to 26 are views for describing intermediate operations of a method of manufacturing a semiconductor device according to an exemplary embodiment of the present disclosure.

Referring to FIG. 22, a first lower pattern BP1 and an upper pattern structure U_AP may be formed on a substrate 100.

The upper pattern structure U_AP may be disposed on the first lower pattern BP1. The upper pattern structure U_AP may include sacrificial patterns SC_L and active patterns ACT_L that are alternately stacked on the first lower pattern BP1.

The sacrificial pattern SC_L may include a silicon-germanium (SiGe) layer. The active pattern ACT_L may include a silicon (Si) layer.

Subsequently, a dummy gate insulating layer 130$p$, a dummy gate electrode 120$p$, and a dummy gate capping layer 120_HM may be sequentially formed on the upper pattern structure U_AP. The dummy gate insulating layer 130$p$ may include, for example, silicon oxide ($SiO_2$), but the present disclosure is not limited thereto. The dummy gate electrode 120$p$ may include, for example, polysilicon (p-Si), but the present disclosure is not limited thereto. The dummy gate capping layer 120_HM may include, for example, silicon nitride ($Si_3N_4$), but the present disclosure is not limited thereto.

A first pre-gate spacer 140$p$ may be formed on a sidewall of the dummy gate electrode 120$p$. Also, the first pre-gate spacer 140$p$ may be formed on a sidewall of the dummy gate insulating layer 130$p$ and a sidewall of the dummy gate capping layer 120_HM.

Figure 23:
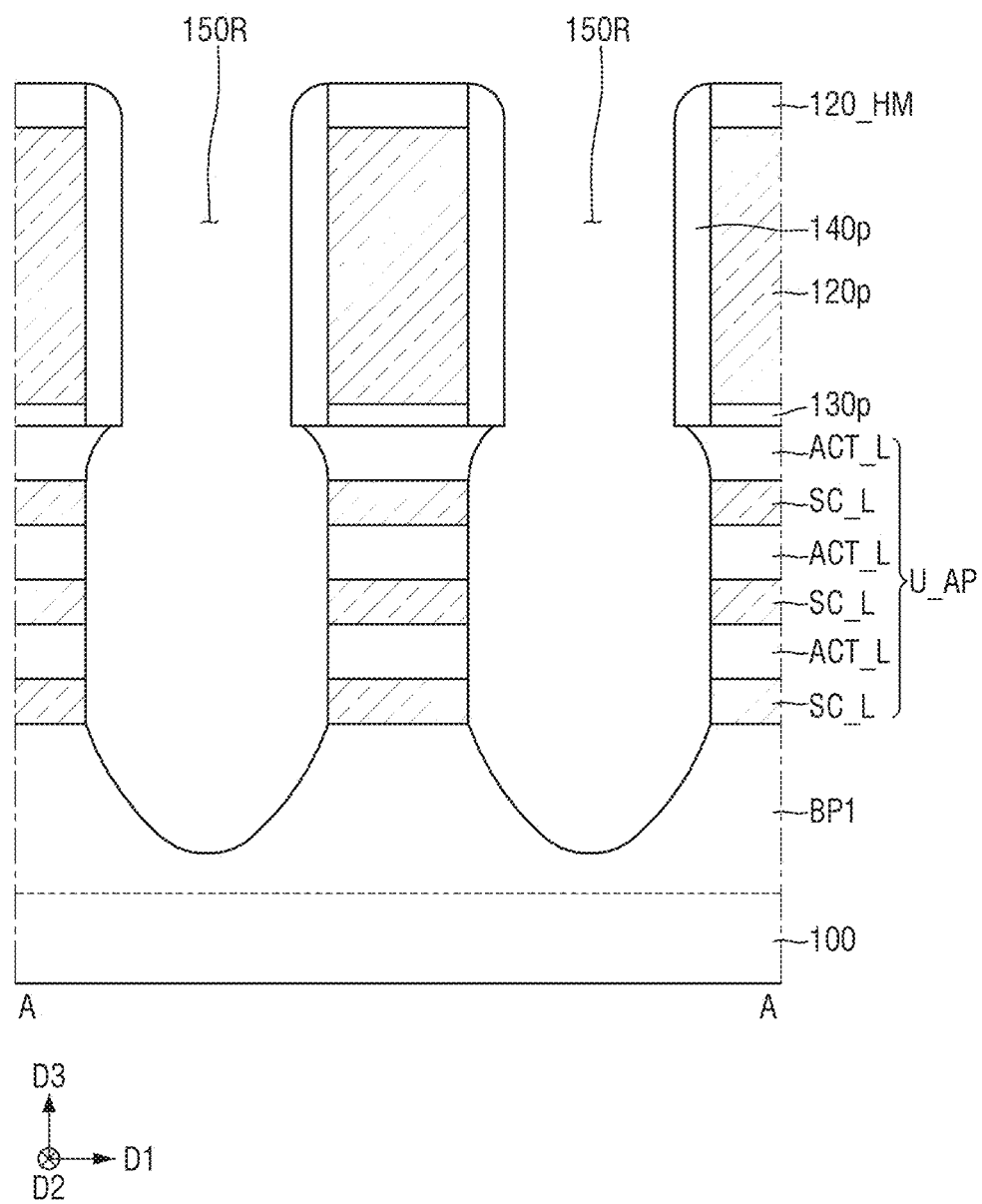

Referring to FIG. 23, a first source/drain recess 150R may be formed in the upper pattern structure U_AP using the dummy gate electrode 120$p$ as a mask. For example, the first source/drain recess 150R may be formed through an etching process using the first pre-gate spacer 140$p$ together with the dummy gate capping layer 120_HM and the dummy gate electrode 120$p$ as an etch mask.

A portion of the first source/drain recess 150R may be formed in the first lower pattern BP1. For example, a portion of the first source/drain recess 150R may form a concave recess in the first lower pattern BP1.

Figure 24:
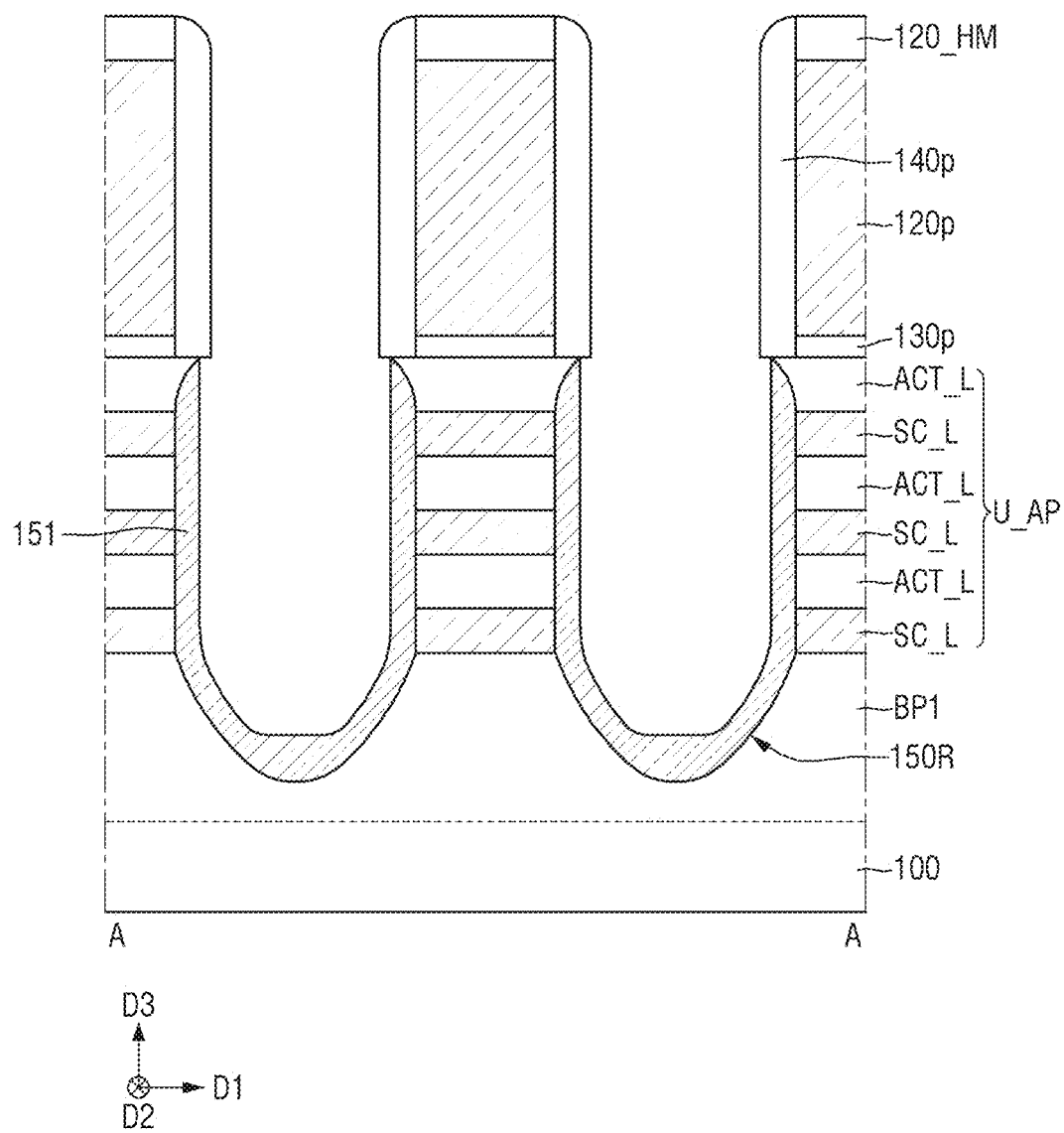

Referring to FIG. 24, a first semiconductor pattern 151 may be formed in the first source/drain recess 150R. The first semiconductor pattern 151 may be formed along a profile of the first source/drain recess 150R. For example, the first semiconductor pattern 151 may be formed through a selective epitaxial growth (SEG) process. The first semiconductor pattern 151 may be a silicon-germanium (SiGe) epitaxial layer with low germanium (Ge) concentration.

Figure 25:
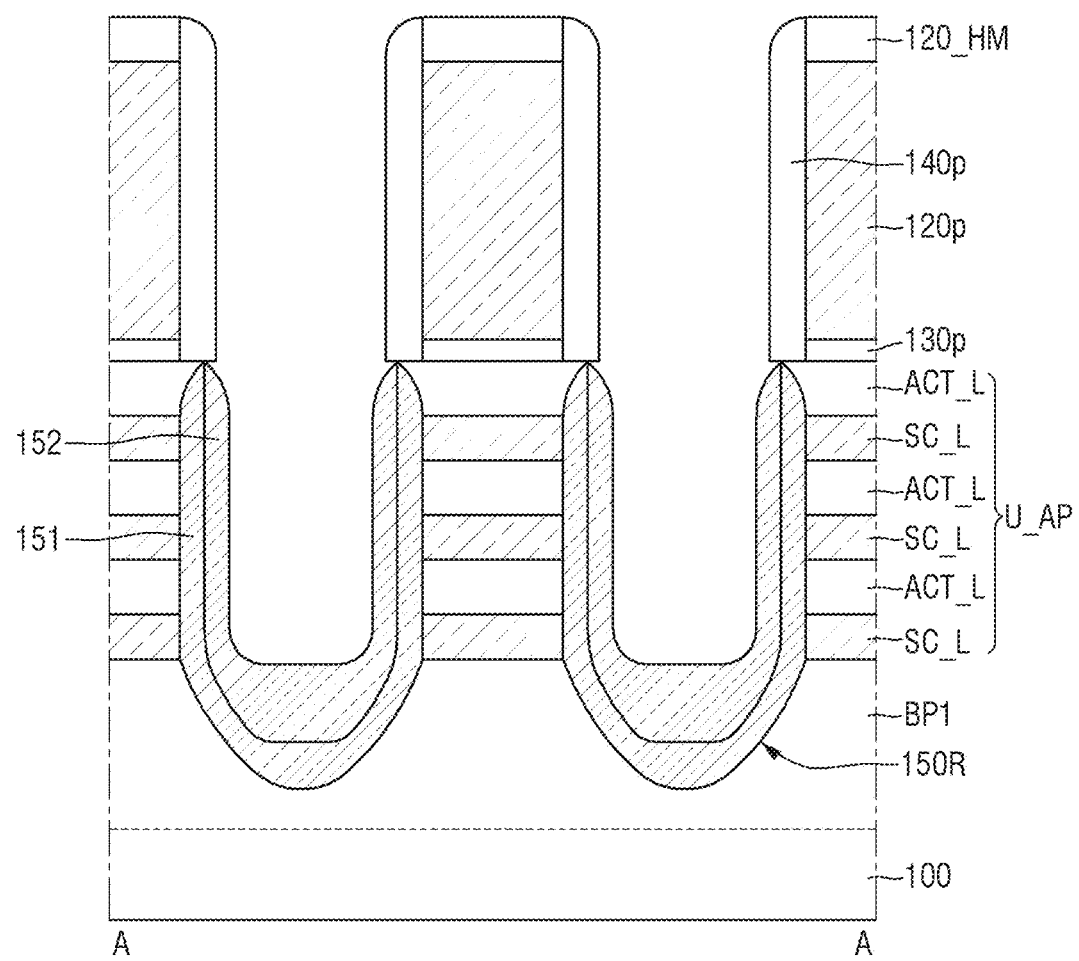

Referring to FIG. 25, a second semiconductor pattern 152 may be formed on the first semiconductor pattern 151.

The thickness of the second semiconductor pattern 152 formed on a lower surface of the first semiconductor pattern 151 may be greater than the thickness of the second semiconductor pattern 152 formed on a side surface of the first semiconductor pattern 151.

The second semiconductor pattern 152 may be grown, for example, at a temperature in a range from about 500° C. to about 650° C. and a pressure in a range from about 10 Torr to about 150 Torr. For example, the second semiconductor pattern 152 may be formed by a bottom up growth process with enhanced low pressure and low temperature, and thus a thicker layer may be formed at the bottom not at the side with the thicker layer having a larger planar portion on the exposed upper surface in comparison to the bottom surface. The second semiconductor pattern 152 may be a silicon-germanium (SiGe) epitaxial layer with low germanium (Ge) concentration.

Figure 26:
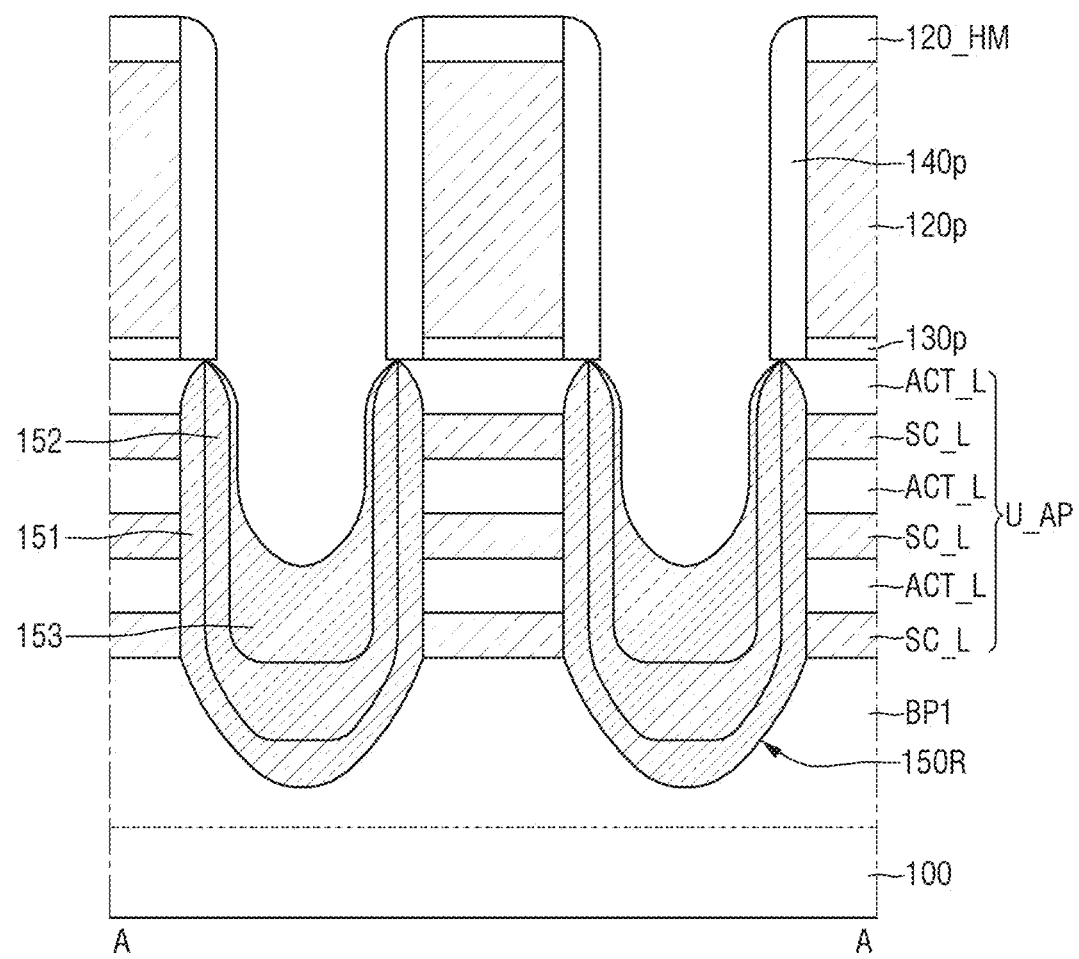

Referring to FIG. 26, a third semiconductor pattern 153 may be formed on the second semiconductor pattern 152. The third semiconductor pattern 153 may be a silicon-germanium (SiGe) epitaxial layer with high germanium (Ge) concentration.

Subsequently, referring to FIG. 2, a fourth semiconductor pattern 154 and a capping semiconductor pattern 155 may be formed on the third semiconductor pattern 153. Accordingly, a first source/drain pattern 150 may be formed. Subsequently, an etch stop layer 185 and an interlayer insulating layer 190 may be sequentially formed on the first source/drain pattern 150. Subsequently, a portion of the interlayer insulating layer 190, a portion of the etch stop layer 185, and the dummy gate capping layer 120_HM may be removed to expose the upper surface of the dummy gate electrode 120p. While the upper surface of the dummy gate electrode 120p is exposed, the first gate spacer 140 may be formed. Subsequently, the sacrificial patterns SC_L, the dummy gate electrode 120p and the dummy gate insulating layer 130p may be removed and then replaced with first gate structures GS1 which may each include, for example, a first gate electrode 120, a first gate insulating layer 130, the first gate spacer 140, and a first gate capping pattern 145.

While the exemplary embodiments of the present disclosure have been described with reference to the accompanying drawings, the present disclosure is not limited to the exemplary embodiments disclosed but may be implemented in various different forms. It will be understood by those skilled in the art that various modifications can be made without departing from the spirit and scope of the present disclosure as defined by the appended claims. Therefore, the above-described exemplary embodiments should be considered in a descriptive sense only and not for purposes of limitation.

What is claimed is:

1. A semiconductor device comprising:
    an active pattern including a lower pattern and a plurality of sheet patterns on the lower pattern and spaced apart from the lower pattern;
    a gate structure on the lower pattern and surrounding the plurality of sheet patterns;
    a source/drain pattern on at least one side of the gate structure and filling a source/drain recess; and
    a source/drain contact on the source/drain pattern,
    wherein the source/drain pattern includes a first semiconductor pattern extending along the source/drain recess and contacting the lower pattern, a second semiconductor pattern on the first semiconductor pattern, a third semiconductor pattern on the second semiconductor pattern, and a fourth semiconductor pattern on the third semiconductor pattern and filing the source/drain recess,
    a side surface of the third semiconductor pattern includes a planar portion,
    a lowermost surface of the second semiconductor pattern includes a planar portion,
    a lowermost surface of the third semiconductor pattern includes a planar portion,
    a length of the planar portion of the lowermost surface of the second semiconductor pattern is smaller than a length of the planar portion of the lowermost surface of the third semiconductor pattern, and
    a thickness of the second semiconductor pattern on the lowermost surface of the third semiconductor pattern is different from a thickness of the second semiconductor pattern on the planar portion of the side surface of the third semiconductor pattern.

2. The semiconductor device of claim 1, wherein a lowermost surface of the source/drain contact is disposed in the fourth semiconductor pattern.

3. The semiconductor device of claim 2, further comprising a metal silicide layer between the source/drain contact and the fourth semiconductor pattern.

4. The semiconductor device of claim 1, wherein a lowermost surface of the source/drain contact is disposed above a lowermost surface of an uppermost sheet pattern of the plurality of sheet patterns.

5. The semiconductor device of claim 1, wherein a lowermost surface of the source/drain contact is disposed below a lowermost surface of an uppermost sheet pattern of the plurality of sheet patterns.

6. The semiconductor device of claim 1, the thickness of the second semiconductor pattern on the lowermost surface of the third semiconductor pattern is greater than the thickness of the second semiconductor pattern on the planar portion of the side surface of the third semiconductor pattern.

7. The semiconductor device of claim 1, wherein at least the planar portion of the side surface of the third semiconductor pattern overlaps a lowermost sheet pattern of the plurality of sheet patterns in a direction in which the active pattern extends.

8. A semiconductor device comprising:
    a first active pattern in a first region of a substrate, the first active pattern including a first lower pattern extending in a first direction and a plurality of first sheet patterns spaced apart from the first lower pattern in a second direction;
    a second active pattern in a second region of the substrate, the second active pattern including a second lower pattern extending in the first direction and a plurality of second sheet patterns spaced apart from the second lower pattern in the second direction;
    a first gate structure on the first lower pattern, the first gate structure including a first gate insulating layer and a first gate electrode extending in a third direction;

a second gate structure on the second lower pattern, the second gate structure including a second gate insulating layer and a second gate electrode extending in the third direction;
a first source/drain pattern on at least one side of the first gate structure and filing a first source/drain recess; and
a second source/drain pattern on at least one side of the second gate structure and filing a second source/drain recess,
wherein the first source/drain pattern includes a first semiconductor pattern extending along the first source/drain recess and contacting the first active pattern, a second semiconductor pattern on the first semiconductor pattern, a third semiconductor pattern on the second semiconductor pattern, and a fourth semiconductor pattern on the third semiconductor pattern and filling the first source/drain recess,
a side surface of the third semiconductor pattern includes a planer portion,
a lowermost surface of the second semiconductor pattern includes a planar portion,
a lowermost surface of the third semiconductor pattern includes a planar portion, and
a length of the planar portion of the lowermost surface of the second semiconductor pattern is smaller than a length of the planar portion of the lowermost surface of the third semiconductor pattern.

9. The semiconductor device of claim 8, wherein
the first source/drain pattern is in contact with the first gate insulating layer,
the second gate structure further comprises an inner spacer between a pair of second sheet patterns among the plurality of second sheet patterns adjacent to each other, and
the inner spacer is between the second gate insulating layer and the second source/drain pattern.

10. The semiconductor device of claim 8, wherein
the first source/drain pattern is in contact with the first gate insulating layer, and
the second source/drain pattern is in contact with the second gate insulating layer.

11. The semiconductor device of claim 8, wherein the second source/drain pattern includes a fifth semiconductor pattern extending along the second source/drain recess and contacting the second active pattern, a sixth semiconductor pattern on the fifth semiconductor pattern, a seventh semiconductor pattern on the sixth semiconductor pattern, and an eighth semiconductor pattern on the seventh semiconductor pattern and filling the second source/drain recess.

12. The semiconductor device of claim 11, wherein
a bottom surface of the second source/drain recess includes a planar portion,
a lowermost surface of the sixth semiconductor pattern includes a planar portion, and
a lowermost surface of the seventh semiconductor pattern includes a planar portion.

13. The semiconductor device of claim 12, wherein the planer portion of the bottom surface of the second source/drain recess overlaps the planer portion of the lowermost surface of the sixth semiconductor pattern and the planer portion of the lowermost surface of the seventh semiconductor pattern in the second direction.

14. The semiconductor device of claim 12, wherein a length of the planer portion of the bottom surface of the second source/drain recess is greater than a length of the planer portion of the lowermost surface of the sixth semiconductor pattern and the planer portion of the lowermost surface of the seventh semiconductor pattern.

15. The semiconductor device of claim 11, wherein a width of the first active pattern in the third direction is smaller than a width of the second active pattern in the third direction.

16. The semiconductor device of claim 11, wherein
at least the planer portion of the side surface of the third semiconductor pattern overlaps a lowermost first sheet pattern of the plurality of first sheet patterns in the first direction, and
at least the planer portion of the side surface of the seventh semiconductor pattern overlaps a lowermost second sheet pattern of the plurality of second sheet patterns in the first direction.

17. The semiconductor device of claim 11, wherein a thickness of the fifth semiconductor pattern in the first direction decreases and then increases as it moves away from the first lower pattern.

18. A semiconductor device comprising:
an active pattern including a lower pattern and a plurality of sheet patterns on the lower pattern and spaced apart from the lower pattern;
a gate structure on the lower pattern and surrounding the plurality of sheet patterns; and
a source/drain pattern on at least one side of the gate structure and filling a source/drain recess,
wherein the source/drain pattern includes a first semiconductor pattern extending along the source/drain recess and contacting the lower pattern, a second semiconductor pattern on the first semiconductor pattern, a third semiconductor pattern on the second semiconductor pattern, a fourth semiconductor pattern on the third semiconductor pattern and filing the source/drain recess, and a capping semiconductor pattern on the fourth semiconductor pattern,
a lowermost surface of the third semiconductor pattern is disposed below a lowermost surface of a lowermost sheet pattern of the plurality of sheet patterns,
a side surface of the third semiconductor pattern includes a planar portion,
a lowermost surface of the second semiconductor pattern includes a planar portion,
a lowermost surface of the third semiconductor pattern includes a planar portion,
a length of the planar portion of the lowermost surface of the second semiconductor pattern is smaller than a length of the planar portion of the lowermost surface of the third semiconductor pattern, and
a thickness of the second semiconductor pattern on the lowermost surface of the third semiconductor pattern is different from a thickness of the second semiconductor pattern on the planar portion of the side surface of the third semiconductor pattern.

19. The semiconductor device of claim 18, wherein
each of the first semiconductor pattern, the second semiconductor pattern, the third semiconductor pattern, the fourth semiconductor pattern and the capping semiconductor pattern includes silicon-germanium,
a germanium fraction of the fourth semiconductor pattern is greater than a germanium fraction of the third semiconductor pattern,
the germanium fraction of the third semiconductor pattern is greater than a germanium fraction of the second semiconductor pattern, the germanium fraction of the second semiconductor pattern is greater than a germanium fraction of the first semiconductor pattern, and the germanium fraction of the first semiconductor pattern is greater than a germanium fraction of the capping semiconductor pattern.

20. The semiconductor device of claim 18, wherein an upper surface of the capping semiconductor pattern includes a downwardly convex portion.

\* \* \* \* \*